(12) United States Patent
Tanaka et al.

(10) Patent No.: US 12,059,744 B2
(45) Date of Patent: Aug. 13, 2024

(54) LASER MACHINING DEVICE

(71) Applicant: SUMITOMO HEAVY INDUSTRIES, LTD., Tokyo (JP)

(72) Inventors: Teppei Tanaka, Kanagawa (JP); Satoshi Aizawa, Kanagawa (JP); Takeshi Aiba, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 305 days.

(21) Appl. No.: 16/560,603

(22) Filed: Sep. 4, 2019

(65) Prior Publication Data

US 2020/0016691 A1   Jan. 16, 2020

Related U.S. Application Data

(63) Continuation of application No. PCT/JP2018/009373, filed on Mar. 12, 2018.

(30) Foreign Application Priority Data

Mar. 13, 2017  (JP) ................................. 2017-046948
Mar. 23, 2017  (JP) ................................. 2017-056827
Mar. 23, 2017  (JP) ................................. 2017-056828

(51) Int. Cl.
  B23K 26/03    (2006.01)
  B23K 26/082   (2014.01)
  B23K 26/21    (2014.01)

(52) U.S. Cl.
  CPC .......... *B23K 26/034* (2013.01); *B23K 26/082* (2015.10); *B23K 26/21* (2015.10)

(58) Field of Classification Search
  CPC ................ B23K 26/00; B23K 26/0626; B23K 26/064; B23K 26/034; B23K 26/03; B23K 26/352; B23K 26/0006; B23K 26/082; B23K 26/21; B23K 26/0613; B23K 26/354; B23K 26/0622; B23K 26/0608; B23K 26/0853;

(Continued)

(56) References Cited

U.S. PATENT DOCUMENTS

| 2006/0131289 A1* | 6/2006 | Jyumonji | B23K 26/0853 219/121.65 |
| 2013/0052756 A1* | 2/2013 | Okujo | H05B 3/0047 219/491 |
| 2015/0158119 A1 | 6/2015 | Nakamura et al. | |

FOREIGN PATENT DOCUMENTS

| JP | H08-220008 A | 8/1996 |
| JP | 2004-228486 A | 8/2004 |

(Continued)

OTHER PUBLICATIONS

International Search Report issued in Application No. PCT/JP2018/009373, mailed Jun. 5, 2018.
Search Report issued in European Application No. 18767578.0, dated Mar. 25, 2020.

Primary Examiner — Nathaniel E Wiehe
Assistant Examiner — Dilnessa B Belay
(74) Attorney, Agent, or Firm — Michael Best & Friedrich LLP

(57) ABSTRACT

There is provided a laser machining device including a heat radiation measurement unit that measures intensity of heat radiation of a workpiece irradiated with a laser beam, and a determination unit that determines a state of a target by defining an object used in machining work as the target, based on the intensity of the heat radiation measured by the heat radiation measurement unit.

10 Claims, 14 Drawing Sheets

(58) Field of Classification Search
CPC .................. H01L 21/268; H01L 22/12; H01L 21/67115; H01L 21/683; H01L 21/265; H01L 29/78; H01L 21/26513; H01L 21/8249; H01L 29/66348; H01L 21/3247; H01L 29/7397; H01L 29/66136; H01L 29/0684; H01L 29/0834; H01L 29/66333; H01L 27/0727; H01L 29/6609; H01L 29/7393; H01L 21/324; H01L 22/14; H01L 21/046; H01L 21/2026; B21D 43/006; B21D 39/02; B21D 26/053; B21D 26/033; B21D 43/003; G01R 31/2831; C30B 33/02

See application file for complete search history.

(56) References Cited

FOREIGN PATENT DOCUMENTS

| | | | |
|---|---|---|---|
| JP | 2005-007415 | A | 1/2005 |
| JP | 2006263810 | A * | 10/2006 |
| JP | 2008-112805 | A | 5/2008 |
| JP | 2011-003630 | A | 1/2011 |
| JP | 5018676 | B2 * | 9/2012 |
| JP | 2017-022332 | A | 1/2017 |
| JP | 2017022332 | A * | 1/2017 |
| WO | WO-2012/173008 | A1 | 12/2012 |
| WO | WO-2013/171848 | A1 | 11/2013 |

* cited by examiner

LASER MACHINING DEVICE

RELATED APPLICATIONS

The contents of Japanese Patent Application No. 2017-046948, Japanese Patent Application No. 2017-056827, Japanese Patent Application No. 2017-056828, and of International Patent Application No. PCT/JP2018/009373, on the basis of each of which priority benefits are claimed in an accompanying application data sheet, are in their entirety incorporated herein by reference.

BACKGROUND

Technical Field

Certain embodiments relate to a laser machining device.

Description of Related Art

In the related art, a laser machining device is known which irradiates a workpiece with a laser beam so as to carry out predetermined machining work including drilling, annealing, or welding work.

The related art discloses a configuration of a laser welding device as follows. A temperature of a welding location is detected by an infrared detector so as to detect a defect in the welding work.

SUMMARY

According to an embodiment of the present invention, there is provided a laser machining device including a heat radiation measurement unit that measures intensity of heat radiation of a workpiece irradiated with a laser beam, and a determination unit that determines a state of a target by defining an object used in machining work as the target, based on the intensity of the heat radiation measured by the heat radiation measurement unit.

BRIEF DESCRIPTION OF THE DRAWINGS

FIG. 14A illustrates the scanning pattern of "Plus", FIG. 14B illustrates the scanning pattern of "Minus", and FIG. 14C illustrates the scanning pattern of "Raster".

DETAILED DESCRIPTION

A laser machining device uses a laser beam source, an optical system, and a workpiece so as to form a machined product corresponding to a machining content in a machining location. That is, in a case of a laser drilling device, a hole portion is generated. In a case of a laser annealing device, a transformation portion is generated by heating. In a case of a laser welding device, a welding portion is generated.

According to a technique disclosed in PTL 1, a defect in the welding portion, that is, a portion generated through machining work, is detected based on a temperature detected by an infrared detector. However, PTL 1 does not disclose a technical idea of inspecting or controlling an object used in laser machining work, for example, such as a laser beam source, an optical system or a workpiece, based on the temperature detected by the infrared detector.

It is desirable to provide a laser machining device which can realize easy and proper inspection for an object used in laser machining work.

According to an embodiment of the present invention, an advantageous effect is achieved in that easy and proper inspection can be realized for an object used in laser machining work.

Hereinafter, respective embodiments of the present invention will be described in detail with reference to the drawings.

Embodiment 1

In the related art, a laser machining device is known which carries out machining work for a workpiece by using a laser beam. The laser machining device includes a laser annealing device that uses a wafer of a semiconductor element material as a workpiece, and that performs heat treatment on a surface portion of the workpiece by scanning the surface portion of the workpiece with a laser beam. As a technique relating to Embodiment 1, PTL 1 (Japanese Unexamined Patent Publication No. 2005-007415) discloses a configuration in which the laser welding device detects a welding defect by causing an infrared detector to detect a temperature of a welding location.

In some cases, the workpiece may include an abnormality such as a crack, foreign substance contamination, or severe warpage. However, in the related art, when machining work is carried out for the workpiece by using the laser machining device, it is not possible to detect the abnormality included in the workpiece. The technique disclosed in PTL 1 is used in order to detect whether there is a defect in a machined portion, and is not used in order to detect the abnormality included in the workpiece.

The invention according to Embodiment 1 aims to provide a laser machining device capable of detecting an abnormal location included in the workpiece during a machining process.

Figure 1:
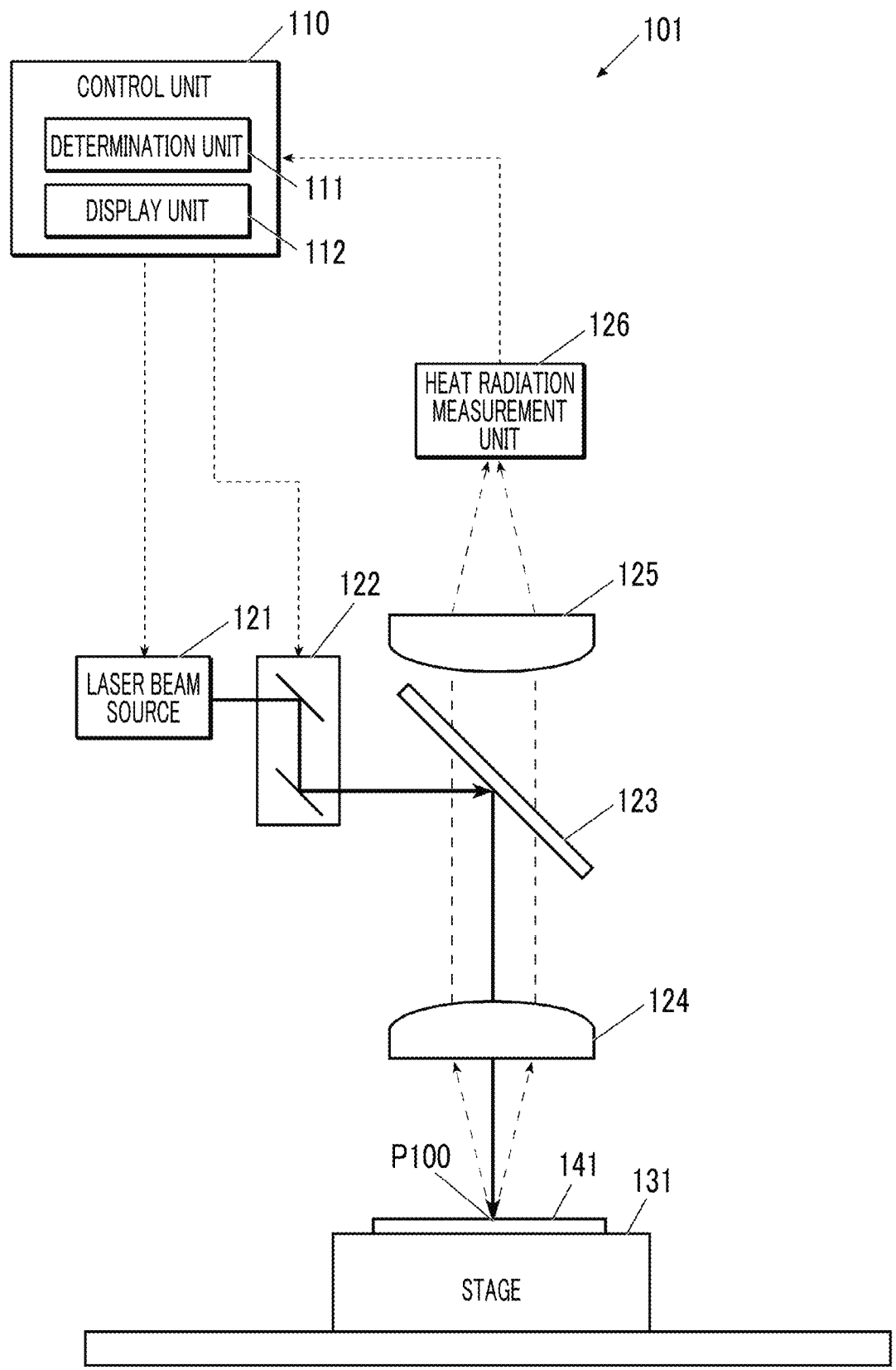
FIG. 1 is a configuration diagram illustrating a laser machining device according to Embodiment 1 of the present invention.

Subsequently, a laser machining device 101 according to Embodiment 1 will be described. FIG. 1 is a configuration diagram illustrating the laser machining device according to Embodiment 1 of the present invention. In the drawings, an optical axis of a laser beam is illustrated using a solid line, heat radiation is illustrated using a thick broken line, and a control line and an output line of a measurement result are illustrated using a thin broken line.

The laser machining device 101 according to Embodiment 1 is a laser annealing device which performs annealing treatment on a workpiece 141 by defining a wafer of a semiconductor element material as the workpiece 141. The annealing treatment is a process of heating a surface portion of the workpiece 141 to a high temperature by scanning an entire two-dimensional region set on the surface portion of the workpiece 141 with the laser beam.

The laser machining device 101 includes a control unit 110, a laser beam source 121, a scanning optical system 122, a dichroic mirror 123, lenses 124 and 125, a heat radiation measurement unit 126, and a stage 131. The scanning optical system 122 corresponds to an example of a scanning unit according to an embodiment of the present invention.

For example, the laser beam source 121 is a solid laser such as a YAG laser or a gas laser such as a $CO_2$ laser, and outputs the laser beam with which the workpiece 141 is irradiated so as to heat a machining target position P100 of the workpiece 141 to a high temperature. The laser beam source 121 may be called a laser oscillator.

For example, the scanning optical system 122 includes a galvano mirror, and can change the irradiation position of the laser beam, that is, the machining target position P100, in two directions along an upper surface of the stage 131, for example.

The dichroic mirror 123 reflects light of an output wavelength of the laser beam source 121, and transmits light of an infrared region including the heat radiation.

For example, the lens 124 is an Fθ lens, and converges the laser beam to the machining target position. Also, the lens 124 collects the heat radiation from the machining target position P100 of the workpiece.

The lens 125 converges the heat radiation collected by the lens 124 and transmitted through the dichroic mirror 123 to the heat radiation measurement unit 126.

For example, the heat radiation measurement unit 126 measures intensity of the heat radiation input to a light receiving unit serving as an infrared sensor.

The stage 131 holds the workpiece 141. The stage 131 may be configured to be movable in two directions intersecting the optical axis of the laser beam.

The control unit 110 is a computer having a storage device for storing a program, a central processing unit (CPU) for executing the program, a working memory, and an I/O for inputting and outputting a control signal and a detection signal. The control unit 110 performs drive control of the laser beam source 121 and drive control of the scanning optical system 122, and inputs a measurement result of the heat radiation measurement unit 126. The control unit 110 further includes a display unit 112 and a determination unit 111 serving as a functional module for causing the CPU to execute a program.

The determination unit 111 determines an abnormal location included in the workpiece 141, based on data of the intensity of the heat radiation incorporated into the control unit 110.

The display unit 112 is a display capable of displaying warning light or an image. In a case where it is determined that the workpiece 141 has the abnormal location, the display unit 112 displays a notification of the abnormality. The display unit 112 further displays and outputs the data (refer to FIGS. 4A and 4B) of the intensity data of the heat radiation, which is processed into a two-dimensional image after being incorporated into the control unit 110.

Machining Process

Figure 2:
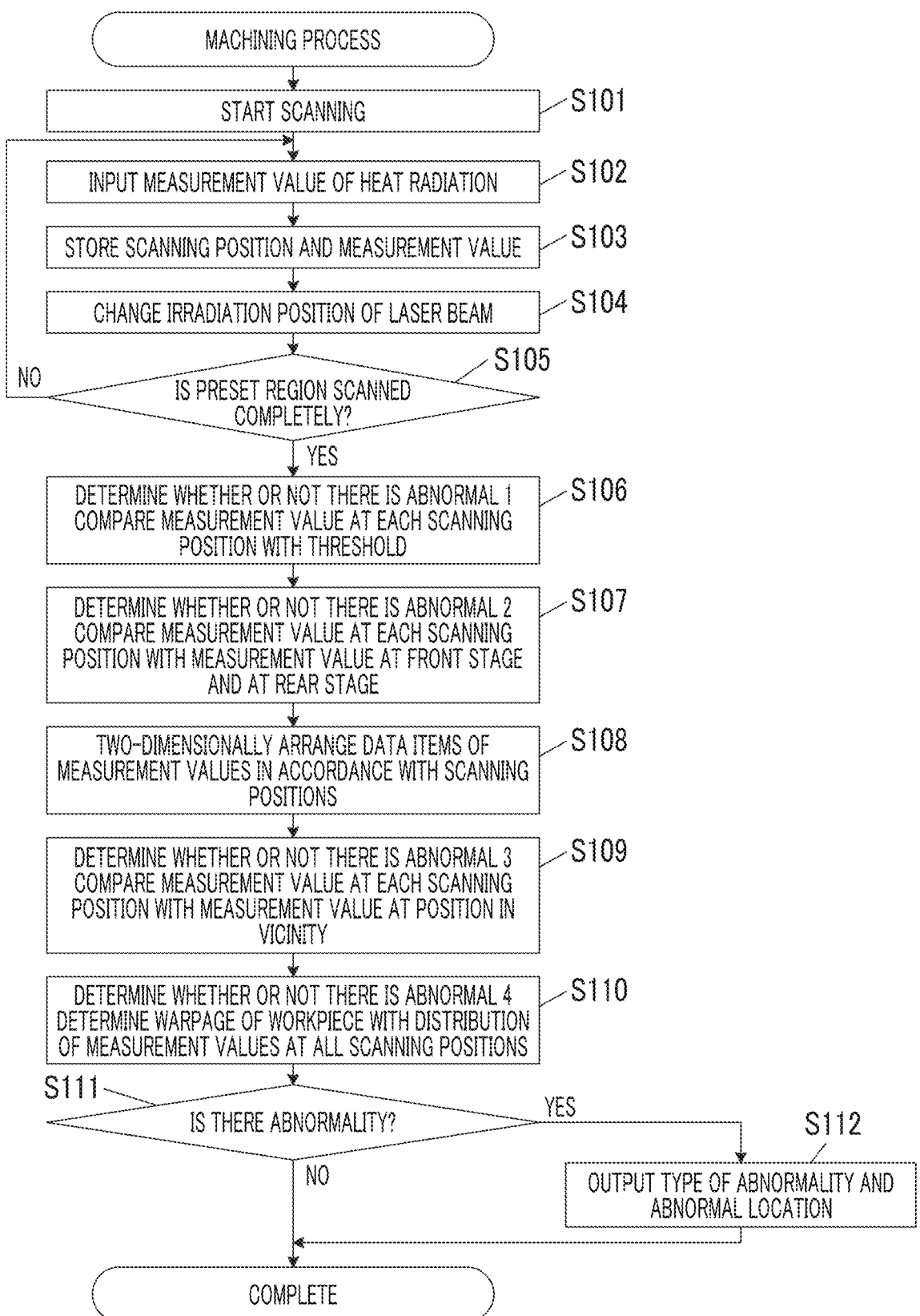
FIG. 2 is a flow chart illustrating a procedure of a machining process performed by a control unit.

FIG. 2 is a flow chart illustrating a procedure of a machining process performed by the control unit.

The machining process in FIG. 2 is a process of detecting whether or not the workpiece 141 is abnormal and whether there is the abnormal location, while the annealing treatment is performed on the workpiece 141. The machining process starts in a state where the workpiece 141 is located on the stage 131.

When the machining process starts, the control unit 110 starts a scanning process of scanning the entire surface portion of the workpiece 141 with the laser beam by driving the laser beam source 121 and (Step S101). Here, the laser beam output from the laser beam source 121 passes through the scanning optical system 122, the dichroic mirror 123, and the lens 124, and the machining target position P100 of the workpiece 141 is irradiated with the laser beam so as to heat the machining target position P100 to a high temperature. Furthermore, the heat radiation is discharged from the machining target position P100 heated to a high temperature, and passes through the lens 124, the dichroic mirror 123, and the lens 125, thereby causing the heat radiation to be collected by the light receiving unit of the heat radiation measurement unit 126. The heat radiation measurement unit 126 outputs a measurement result (for example, a voltage) corresponding to the intensity of the received heat radiation.

If the scanning starts, the control unit 110 proceeds to the loop processing in Steps S102 to S105. In the loop processing, first, the control unit 110 continuously outputs the laser beam, and controls the scanning optical system 122 so that the irradiation position of the laser beam is changed to a subsequent position along a preset route (Step S102). In this manner, the subsequent position in the scanning route is set as the machining target position P100, and the subsequent position is irradiated with the laser beam, thereby discharging the heat radiation from the position. Then, the heat radiation measurement unit 126 measures the intensity of the heat radiation, and the control unit 110 inputs a measurement value (Step S103). Next, the control unit 110 stores the input measurement value of the heat radiation and the scanning position in association with each other (Step S104). Subsequently, the control unit 110 determines whether a preset region is completely scanned (Step S105). If the scanning is not completed, the process returns to Step S102. However, if the scanning is completed, the control unit 110 finishes the loop processing, and proceeds to the next step.

The loop processing in Steps S102 to S105 above is repeatedly performed. In this manner, the preset two-dimensional region is sequentially irradiated with the laser beam, and the annealing treatment is completely performed on the set region of the workpiece 141. In addition, the measurement value of the intensity of the heat radiation obtained when at each scanning position of the workpiece 141 is irradiated with the laser beam is incorporated into the control unit 110.

If the loop processing is finished, the control unit 110 determines whether or not the workpiece 141 is abnormal, based on the incorporated measurement value of the intensity of the heat radiation. Subsequently, an example will be described which adopts four abnormality determination processes.

In a first abnormality determination process (Step S106), the control unit 110 compares the measurement value of the heat radiation at each scanning position with one or both of an upper limit threshold and a lower limit threshold for identifying the abnormality. Then, the control unit 110 determines the scanning position having the measurement value beyond the upper limit threshold or the scanning position having the measurement value below the lower limit threshold, as the abnormal location. In the workpiece 141 such as the wafer, if there is the crack or the foreign substance contamination, high-temperature heat generated by the irradiation of the laser beam is transferred to the location of the crack or the foreign substance in an unusual manner. Accordingly, the measurement value of the heat radiation increases or decreases around the location of the crack or the foreign substance. Therefore, the abnormal locations can be determined by performing the first abnormality determination process.

Figure 3A:
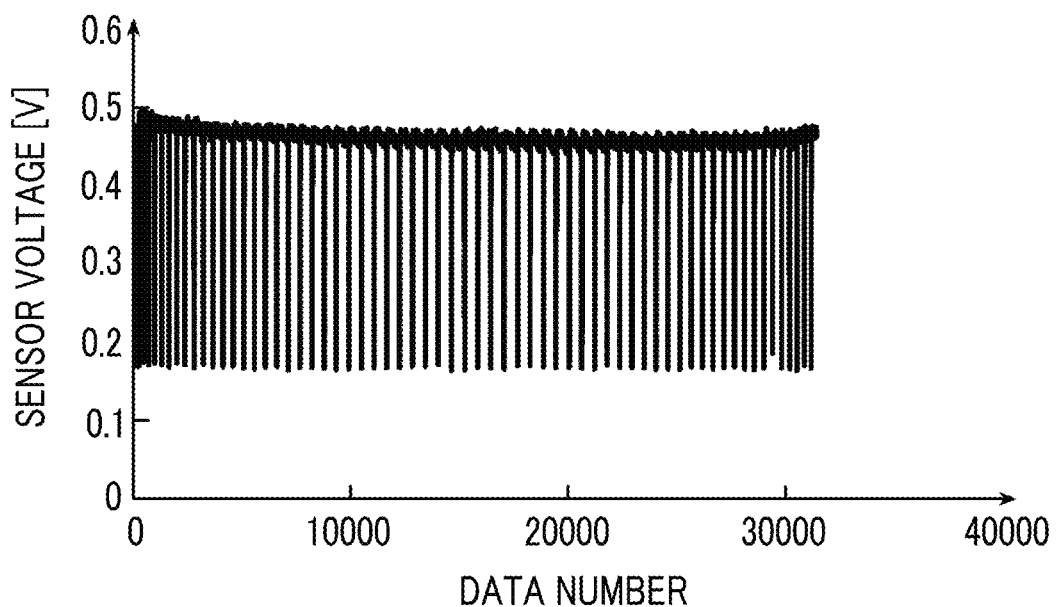
FIG. 3A is a graph illustrating an example of data of heat radiation acquired by loop processing in Steps S102 to S105 in FIG. 2, and illustrates data determined to be normal.
Figure 3B:
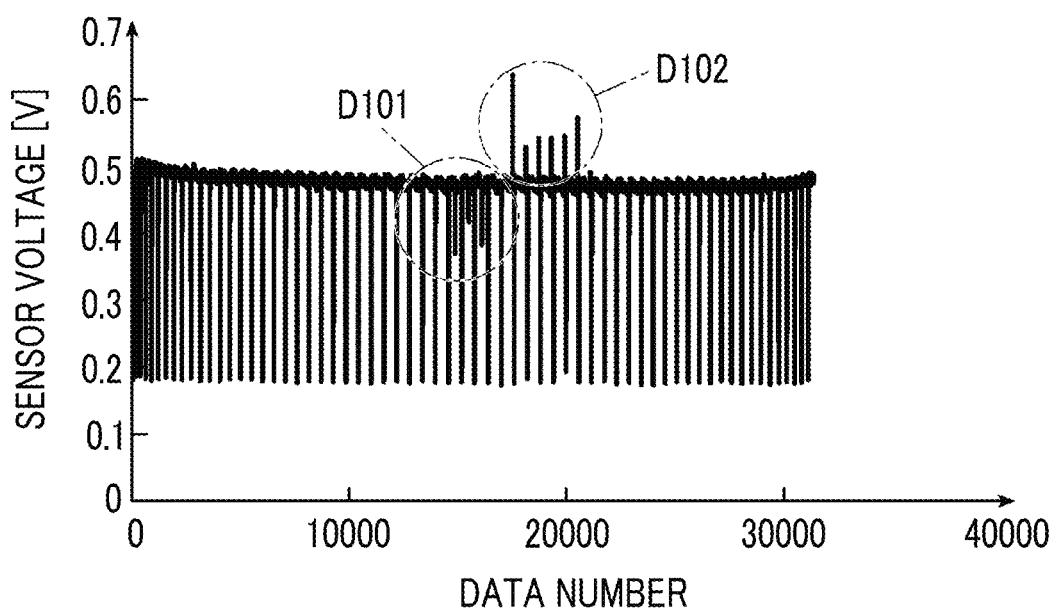
FIG. 3B is a graph illustrating an example of data of heat radiation acquired by loop processing in Steps S102 to S105 in FIG. 2, and illustrates data determined to be abnormal.

FIGS. 3A and 3B are graphs illustrating an example of data of the heat radiation which is acquired by performing the loop processing in Steps S102 to S105 in FIG. 2.

In a second abnormality determination process (Step S107), as illustrated by a graph in FIG. 3A or 3B, the control unit 110 compares the measurement value obtained at each scanning position with the measurement value obtained at a front stage position and the measurement value obtained at a rear stage position, along the incorporated order of the data of the measurement value of the heat radiation. Here, the "measurement value obtained at each scanning position" corresponds to the "intensity of the heat radiation obtained when the first position is irradiated with the laser beam" according to the present invention. The "measurement value obtained at the front position and the measurement value obtained at the rear position" correspond to the "intensity of the heat radiation obtained when the vicinity of the first position is irradiated with the laser beam" according to the present invention. When the comparison is performed, the control unit 110 may calculate movement averages of the measurement values obtained at the respective scanning positions, and may perform the comparison using statistically processed values of the measurement values, as in a case where the movement average values are compared with each other. Then, the control unit 110 determines that the scanning positions (for example, locations D101 and D102 in FIG. 3B) having a rapid change in the measurement value are abnormal locations. As described above, in a case where the workpiece 141 such as the wafer has the crack or the foreign substance contamination, the high-temperature heat generated by the irradiation of the laser beam is transferred to the location of the crack or the foreign substance in an unusual manner. Therefore, a rapid change is likely to appear in the measurement value of the heat radiation around the location of the crack or the foreign substance. If there is no abnormality, as illustrated in FIG. 3A, the rapid change does not appear in the measurement value. Therefore, the abnormal locations can be determined by the second abnormality determination process.

Figure 4A:
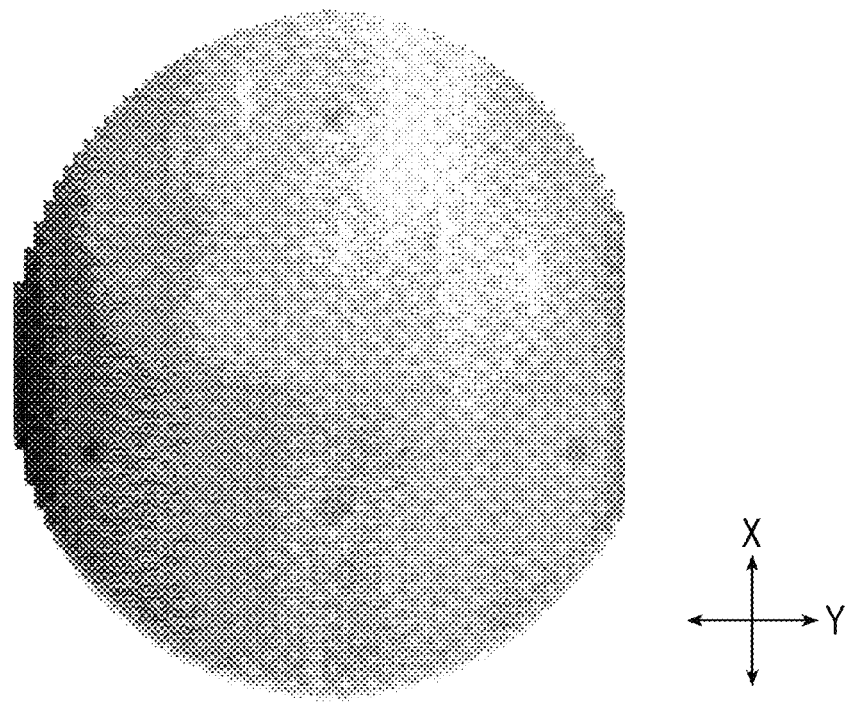
FIG. 4A is a view illustrating an example of data of heat radiation two-dimensionally arranged through Step S108 in FIG. 2, and illustrates data determined to be normal.
Figure 4B:
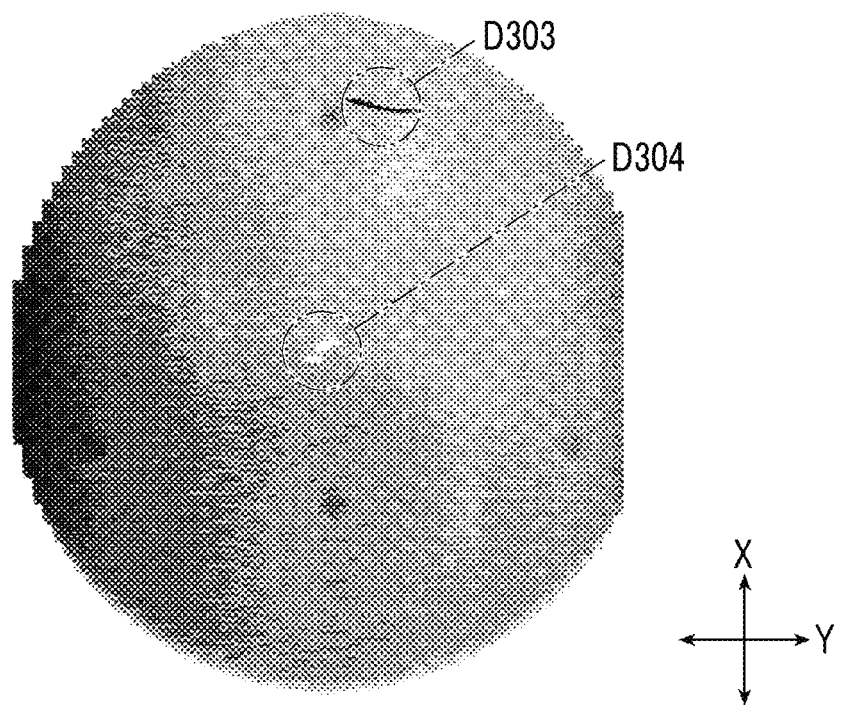
FIG. 4B is a view illustrating an example of data of heat radiation two-dimensionally arranged through Step S108 in FIG. 2, and illustrates data determined to be abnormal.

FIGS. 4A and 4B illustrate an example of data of heat radiation two-dimensionally arranged through Step S108 in FIG. 2. FIGS. 4A and 4B illustrate data obtained when the intensity of the heat radiation is measured at each scanning position by performing the scanning with the laser beam in an X-axis direction and performing the scanning multiple times while shifting the position in a Y-axis direction. In FIGS. 4A and 4B, the intensity of the heat radiation is illustrated using color shades.

In a third abnormality determination process (Steps S108 and S109), first, the control unit 110 two-dimensionally arranges a series of data items of the measurement values of the heat radiation in accordance with the scanning positions (Step S108). In this manner, as illustrated in FIG. 4A or 4B, a series of the measurement values of the heat radiation incorporated in time series are illustrated in association with positions on an X-Y coordinate on which the surface portion of the workpiece 141 is projected.

Next, the control unit 110 compares the measurement value obtained at each scanning position with the measurement value obtained at the position in the vicinity thereof, based on the data of the measurement value of the heat radiation which is associated with the position in the X-Y coordinate (Step S109). When the comparison is performed, the control unit 110 may calculate movement averages of the measurement values obtained at the respective scanning positions, and may perform the comparison using statistically processed values of the measurement values, as in a case where the movement average values are compared with each other. In Step S109, the control unit 110 determines whether or not there is a location where the intensity of the heat radiation is rapidly changed not only in a scanning direction (X-axis direction) of the laser beam but also in an intersecting direction thereof (Y-axis direction). Then, the control unit 110 determines that the scanning position (for example, locations D303 and D304 in FIG. 4B) having a rapid change in the measurement value is the abnormal location on the two-dimensional X-Y coordinate. As described above, in a case where the workpiece 141 such as the wafer has the crack or the foreign substance contamination, the measurement value of the heat radiation is likely to be rapidly changed around this location. For example, the location D303 is a location where the wafer has a flaw, and the location D304 is a location where the foreign substance is present. If there is no abnormality, as illustrated in FIG. 4B, there is no location where the measurement value of the heat radiation is rapidly changed. The abnormal location can be determined by performing the third abnormality determination process, in a case where the abnormal location present is in the middle of the scanning route of the laser beam or between the scanning routes adjacent to each other.

In a fourth abnormality determination process (Step S110), first, the control unit 110 analyzes the distribution of the measurement values on the X-Y coordinate, based on the data of the measurement values of the heat radiation which are developed on the X-Y coordinate. Then, the control unit 110 analyzes whether or not the distribution of the measurement values has a predetermined characteristic, and determines a pattern of a warpage of the workpiece, a position of the warpage, or a size of the warpage, based on a result of the analysis. In the analysis process, the control unit 110 may store distribution data of the measurement values of the heat radiation for the plurality of the workpieces having the warpage with several patterns, as reference data, and may analyze the distribution by calculating these reference data and The distribution may be analyzed by calculating a common degree between the reference data and the distribution of the measurement values of the heat radiation. If the wafer has the warpage, the irradiation position of the laser beam is changed in a height direction in accordance with the pattern of the warpage. Accordingly, the pattern of the warpage appears in the distribution pattern of the measurement values of the heat radiation. Therefore, the abnormality relating to the warpage of the workpiece 141 can be determined by performing the fourth abnormality determination process.

If the abnormality determination process is completely performed, the control unit 110 determines whether or not the determination result is abnormal. If the determination result is abnormal, for example, the control unit 110 outputs a type of the abnormality and the abnormal location by using a data output, a display output, or a print output (Step S112). When the data is output, the abnormal location may be indicated using an image.

In a case where the workpiece 141 is the wafer provided with a pattern, the intensity of the heat radiation may be rapidly changed at a pattern boundary, even if the pattern boundary is a normal location. In this case, the abnormal location indicated using the image. In this manner, an operator can distinguish the originally abnormal location and the normal location such as the pattern boundary from each other by comparing the image with the pattern of the wafer. Alternatively, although there is no abnormality as in the pattern boundary, in a case where the position where the intensity of the heat radiation is rapidly changed is known in advance, the information may be stored in the control unit 110. Then, based on the information, the control unit 110 may be configured so that the location where the intensity of the heat radiation is rapidly changed rapidly although there is no abnormality is excluded from abnormality determination locations.

If the control unit 110 outputs the abnormality in Step S112 or determines that there is no abnormality in Step S111, the control unit 110 completes the machining process in FIG. 2.

As described above, according to the laser machining device 101 of Embodiment 1, the laser machining device 101 not only can perform the machining process by scanning the workpiece 141 with the laser beam, but also can determine whether or not the workpiece 141 has the abnormal location during the machining process. Therefore, it is not necessary to spend time only for the inspection. Simultaneously with the machining process, the abnormal location of the workpiece 141 can be detected. In this manner, a yield rate of final products can be improved by removing the abnormal workpiece from the manufacturing process.

In addition, according to the second abnormality determination process (Step S107) and the third abnormality determination process (Step S108), the abnormal location is determined by comparing the measurement value of the heat radiation obtained at each scanning position with the measurement value of the heat radiation obtained in the vicinity thereof. Therefore, if the measurement value of the heat radiation generally increases or decreases due to a type or a thickness of the workpiece, even in a case where a threshold of the measurement value which enables the abnormality to be identified is not determined, the abnormal location of the workpiece can be determined.

Hitherto, Embodiment 1 according to the present invention has been described. However, the present invention is not limited to Embodiment 1 described above. For example, in Embodiment 1, a configuration for determining the abnormal location of the workpiece 141 simultaneously with the annealing treatment has been described as an example. However, if the machining process is performed by scanning the surface portion of the workpiece 141 with the laser beam, a process for determining the abnormal location may be performed simultaneously with a process other than the annealing treatment. In addition, in Embodiment 1, as the scanning unit according to the present invention, the scanning optical system 122 has been described which changes the irradiation position of the laser beam. However, the scanning unit according to the present invention may be configured so that a position of the workpiece 141 irradiated with the laser beam is changed by moving the workpiece 141. In addition, in Embodiment 1, the wafer of the semiconductor element material has been described as the workpiece, and the crack, the foreign substance contamination, or the warpage of the wafer has been described as the abnormality. However, various configurations such as an electronic board can be adopted as the workpiece. In addition, as the abnormality to be detected, for example, various abnormalities such as a foreign substance adhering to the surface of the workpiece may be adopted. In addition, details described in Embodiment 1 can be appropriately modified within the scope not departing from the gist of the invention.

Hereinafter, some of the inventions according to Embodiment 1 will be described.

Invention 1

A laser machining device includes a scanning unit that changes an irradiation position of a workpiece irradiated with a laser beam, a heat radiation measurement unit that measures intensity of heat radiation of the workpiece irradiated with the laser beam, and a determination unit that determines an abnormal location of the workpiece, based on the intensity of the heat radiation measured by the heat radiation measurement unit.

Invention 2

In the laser machining device according to Invention 1, the determination unit determines whether or not a first position or the vicinity of the first position of the workpiece is abnormal, based on a comparison between the intensity of the heat radiation obtained when the first position of the workpiece is irradiated with the laser beam and the intensity of the heat radiation obtained when the vicinity of the first position is irradiated with the laser beam.

Invention 3

In the laser machining device according to Invention 1 or 2, the workpiece is a wafer of a semiconductor element material. The scanning unit performs annealing treatment on a surface portion of the workpiece by changing the irradiation position of the workpiece irradiated with the laser beam. The determination unit determines a crack, foreign substance contamination, or warpage of the workpiece.

Advantageous Effect of Inventions Disclosed in Embodiment 1

According to these inventions, during the machining process, the abnormal location included in the workpiece can be detected.

Embodiment 2

As the laser machining device, a laser annealing device is known which performs annealing treatment on the workpiece by defining the wafer of the semiconductor element material as the workpiece. In addition, as the laser machining device, a laser drilling device is known which drills a hole in the workpiece by using the laser beam and setting a substrate having a resin layer and a metal layer as the workpiece, and a laser welding device is known which welds the workpiece. This laser machining device generally has a power measurement unit that measures output power of a laser beam source (for example, refer to PTL 3: Japanese Unexamined Patent Publication No. 2013-233556). Then, before the machining process, the power measurement unit measures the power of the laser beam, and adjusts the output of the laser beam source by performing feedback control. In addition, as a technique relating to the invention according to Embodiment 2, PTL 4 (PCT Japanese Translation Patent Publication No. 11-508322) discloses a technique of monitoring a temperature of a target surface by using an infrared sensor in a laser sintering device using a radiant heater.

In the laser machining device, it is preferable that the power of the laser beam used in irradiating the workpiece is adjusted in accordance with the settings. Through investigations, the present inventors have found out the followings. The power of the laser beam used in irradiating the workpiece is changed due to an output error of the laser beam source, an error factor of an optical system such as dirt or misalignment of a lens or a mirror, and a measurement error of the power measurement unit. Out of these, the output error of the laser beam source can be adjusted within an allowable range, if the measurement of the power measurement unit is correctly performed. In addition, the error factor of the optical system can be found by inspecting a beam shape of the laser beam. On the other hand, the laser machining device in the related art has no means for detecting the measurement error of the power measurement unit. If a relatively big measurement error occurs in the power measurement unit, there is a problem in that the power error increases in the laser beam used in irradiating the machining target position. As an example, the measurement error of the power measurement unit occurs due to a change in an ambient temperature.

The invention according to Embodiment 2 aims to provide a laser machining device which can detect a measurement error in a case where the measurement error exceeds an allowable range in a power measurement unit.

Figure 5:
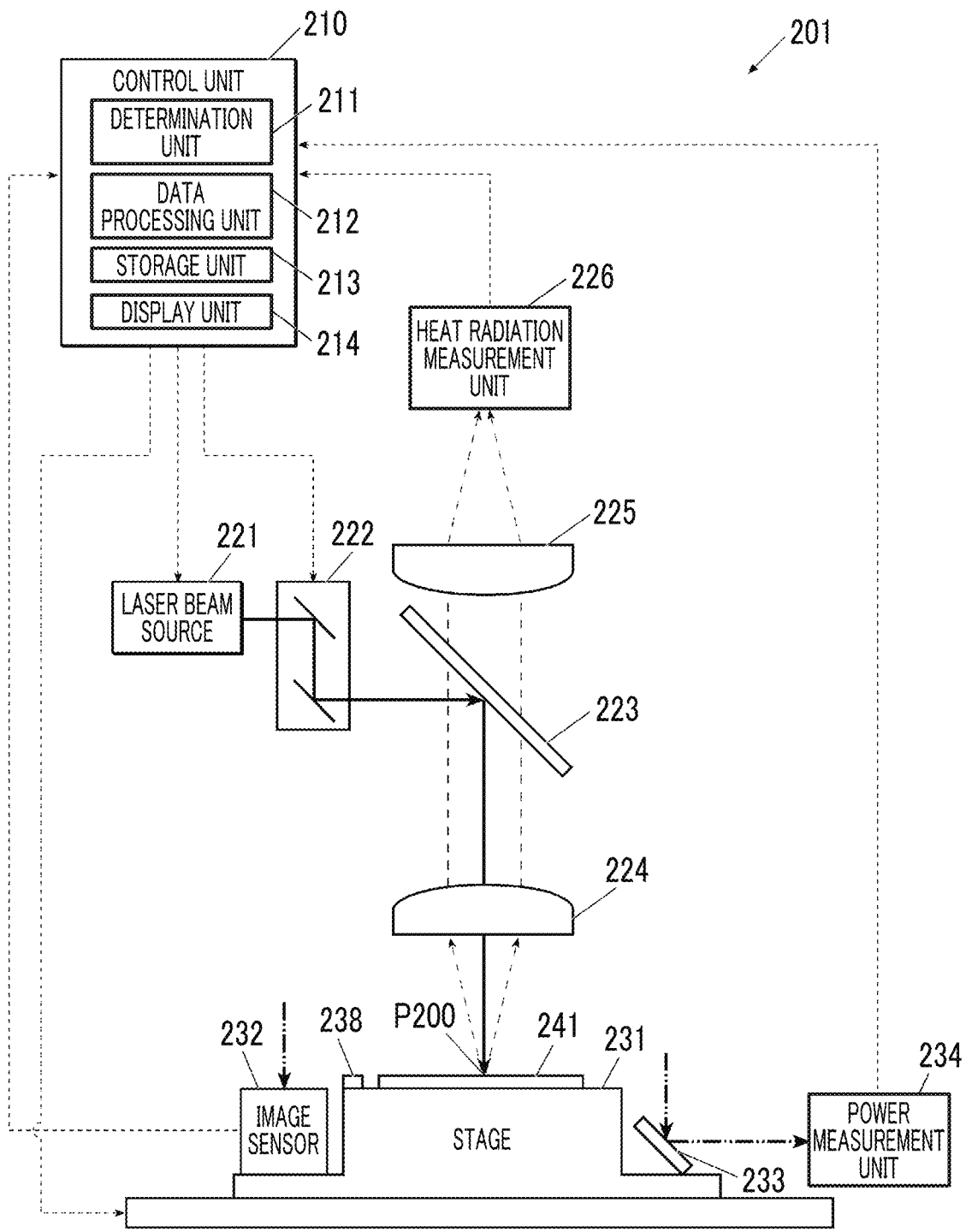
FIG. 5 is a configuration diagram illustrating a laser machining device according to Embodiment 2 of the present invention.

Subsequently, a laser machining device 201 according to Embodiment 2 will be described. FIG. 5 is a configuration diagram illustrating the laser machining device according to Embodiment 2 of the present invention. In FIG. 5, the optical axis of the laser beam is illustrated using a solid line or a two-dot chain line, the heat radiation is illustrated using a thick broken line, and the control line and the output line of the measurement result are illustrated using a thin broken line.

The laser machining device 201 according to Embodiment 2 is a laser annealing device which performs annealing treatment by defining the wafer of the semiconductor element material as a workpiece 241 and irradiating the workpiece 241 with the laser beam. The laser machining device 201 includes a control unit 210, a laser beam source 221, a scanning optical system 222, a dichroic mirror 223, lenses 224 and 225, a heat radiation measurement unit 226, a stage 231, an image sensor 232, a total reflection mirror 233, a power measurement unit 234, and a workpiece for inspection 238.

For example, the laser beam source 221 is a solid laser such as a YAG laser, a gas laser such as a $CO_2$ laser, or a semiconductor laser such as a laser diode (LD), and outputs the laser beam with which the workpiece 241 is irradiated so as to heat a machining target position P200 of the workpiece 241 to a high temperature. The laser beam source 221 may be called a laser oscillator.

For example, the scanning optical system 222 includes a galvano mirror, and can change the irradiation position of the laser beam, that is, the machining target position P200, in two directions along an upper surface of the stage 231, for example. The scanning optical system 222 may be omitted, and the stage 231 holding the workpiece 241 may be moved. In this manner, a configuration may be adopted so that the irradiation position of the laser beam and the workpiece 241 are moved relative to each other.

The dichroic mirror 223 reflects the light having the output wavelength of the laser beam source 221, and transmits the light in the infrared region including the heat radiation.

For example, the lens 224 is an Fθ lens, and converges the laser beam to the machining target position. In addition, the lens 224 collects the heat radiation from the machining target position P200 of the workpiece.

The lens 225 converges the heat radiation collected by the lens 224 and transmitted through the dichroic mirror 223 to the heat radiation measurement unit 226.

For example, the heat radiation measurement unit 226 measures the intensity of the heat radiation input to the light receiving unit which is the infrared sensor.

The stage 231 holds the workpiece 241, and is configured to be movable in two directions intersecting the optical axis of the laser beam. The stage 231 holds the image sensor 232 and the total reflection mirror 233 at a location different from the region holding the workpiece 241. In addition, the stage 231 holds the workpiece for inspection 238 at the same height as the workpiece 241.

For example, the image sensor 232 is a charge coupled device (CCD) camera, and can be moved to the irradiation position of the laser beam (optical axis position of the laser beam emitted from the lens 224 for irradiation) by driving the stage 231. The image sensor 232 images a beam shape of the laser beam at the irradiation position of the laser beam. The beam shape means the intensity distribution inside a beam spot of the laser beam, and also called a beam profile. In FIG. 5, the optical axis of the laser beam when the image sensor 232 is moved to the irradiation position of the laser beam is illustrated by a two-dot chain line.

The total reflection mirror 233 can be moved to the irradiation position of the laser beam (optical axis position of the laser beam emitted from the lens 224 for irradiation) by driving the stage 231. The total reflection mirror 233 reflects the laser beam, and transmits the reflected laser beam to the power measurement unit 234 at the irradiation position of the laser beam. In FIG. 5, the optical axis of the laser beam when the total reflection mirror 233 is moved to the irradiation position of the laser beam is illustrated by a two-dot chain line.

Figure 6:
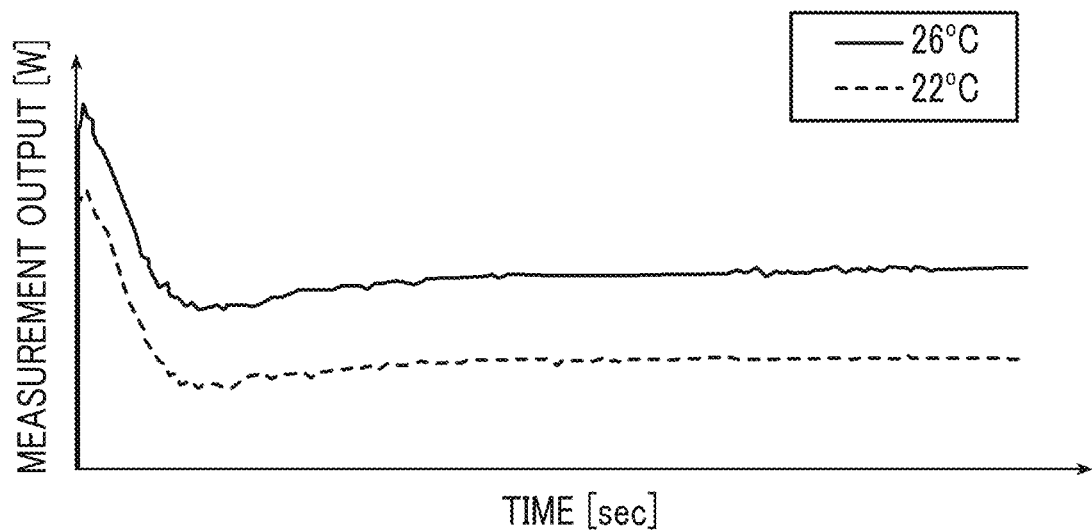
FIG. 6 is a graph illustrating an example of an output of a power measurement unit.

FIG. 6 is a graph illustrating an example of an output of the power measurement unit.

The power measurement unit 234 is also called a power meter, and receives the laser beam so as to measure power of the laser beam. The power means energy per unit time of the laser beam. For example, as the power measurement unit 234, it is possible to adopt a thermal sensor which has a light receiving surface for converting the laser beam into heat so as to measure the power of the laser beam from the temperature of the light receiving surface. As illustrated in FIG. 6, if a short time elapses after the power measurement unit 234 receives the laser beam, the output is stabilized. In a stabilized state, the power measurement unit 234 outputs a measurement result indicating the power of the laser beam. In the power measurement unit 234, an error occurs due to the ambient temperature. For example, even if the laser beams have the same power, as illustrated in FIG. 6, the power measurement unit 234 outputs different measurement results in a case where the ambient temperature is 222° C. and in a case where the ambient temperature is 226° C. The laser machining device 201 is normally operated in an environment controlled to maintain a set ambient temperature. Accordingly, in many cases, the measurement error does not increase due to the ambient temperature of the power measurement unit 234. However, when the abnormality occurs, the measurement error of the power measurement unit 234 may increase due to the ambient temperature or other factors, in some cases.

The workpiece for inspection 238 can be moved to the machining target position P200 irradiated with the laser beam, by driving the stage 231. The workpiece for inspection 238 is a pseudo-workpiece, and is used when inspecting whether there is a big measurement error in the power measurement unit 234. When the power measurement unit 234 is inspected, the same workpiece 238 is used every time. However, the workpiece for inspection 238 may be replaced with a new one periodically or at any desired time. The workpiece for inspection 238 may have the thickness, the width, and the depth which are different from those of the actual workpiece 241. The work is not actually carried out for the workpiece for inspection 238. However, the workpiece for inspection 238 is irradiated with the laser beam in the same manner as the workpiece 238. Accordingly, herein, the workpiece for inspection 238 is called the workpiece. If the workpiece for inspection adopts the same material as the actual workpiece 241, inspection accuracy can be improved. However, if the workpiece for inspection adopts a material whose temperature is raised similarly to that of the actual workpiece 241 by irradiating the material with the laser beam, it is not necessary to adopt the same material as workpiece 241.

The control unit 210 is a computer having a storage device for storing a program, a central processing unit (CPU) for executing the program, a working memory, and an I/O for inputting and outputting the control signal and the detection signal. The control unit 210 performs drive control of the laser beam source 221, drive control of the stage 231, and drive control of the scanning optical system 222. Furthermore, the control unit 210 inputs the measurement value of the heat radiation measurement unit 226, the imaging result of the image sensor 232, the measurement result of the power measurement unit 234, and the measurement result of the heat radiation measurement unit 226. The control unit 210 performs an adjustment process including power adjustment of the laser beam source 221 at a proper timing before the machining process is performed on the workpiece 241.

The control unit 210 further includes a storage unit 213, a display unit 214, and a determination unit 211 and a data processing unit 212 as functional modules which cause the CPU to execute the program. The display unit 214 is a display capable of displaying warning light or an image. In a case where it is determined that the adjustment process is abnormal, the display unit 214 displays a warning. Each function of the determination unit 211, the data processing unit 212, and the storage unit 213 will be described later.

Reference Data Acquisition Process

Figure 7:
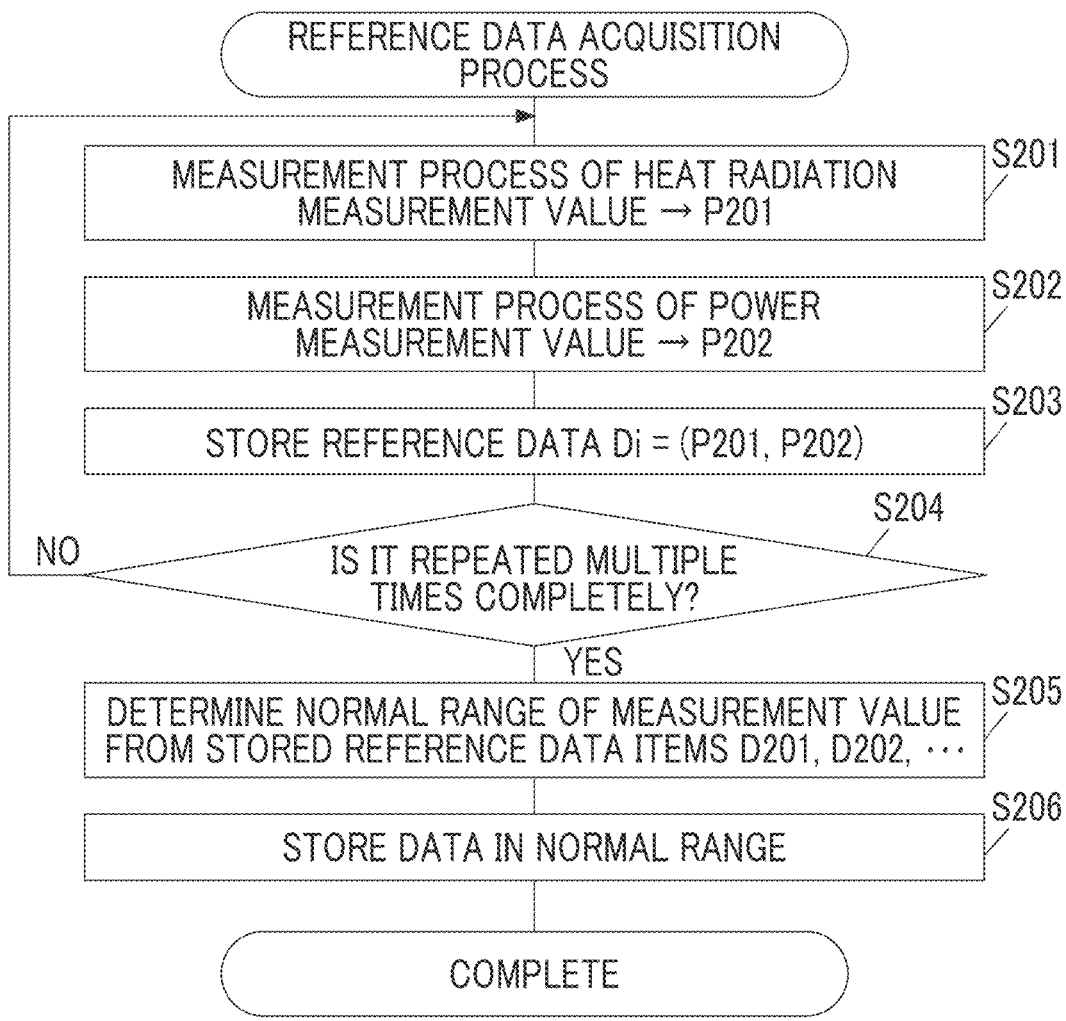
FIG. 7 is a flowchart illustrating a flow of a reference data acquisition process performed by the control unit.

FIG. 7 is a flowchart illustrating a procedure of a reference data acquisition process performed by the control unit.

The reference data acquisition process is a process of acquiring required reference data in advance in order to determine whether the measurement error of the power measurement unit 234 falls within an allowable range. The reference data acquisition process is performed in the following state. An error factor such as dust, dirt, or misalignment is removed from the optical system of the laser machining device 201, and it is guaranteed that an environmental parameter such as the ambient temperature satisfies a preset condition. If this state is ready, a user inputs a start command of the reference data acquisition process to the control unit 210. In this manner, the control unit 210 starts the reference data acquisition process in FIG. 7.

If the reference data acquisition process starts, the control unit 210 first performs a process of measuring the heat radiation by irradiating the workpiece for inspection 238 with the laser beam (Step S201). Specifically, the control unit 210 first moves the workpiece for inspection 238 to the irradiation position of the laser beam by driving the stage 231. Next, the control unit 210 emits the laser beam by driving the laser beam source 221. Then, the workpiece 238 is irradiated with the laser beam passing through the scanning optical system 222, the dichroic mirror 223, and the lens 224 so as to heat the machining target position P200 of the workpiece 238. If the machining target position is heated, the heat radiation corresponding to the heating amount is generated from the machining target position. The heat radiation is incident on the heat radiation measurement unit 226 after passing through the lenses 224, the dichroic mirror 223, and the lenses 225. The heat radiation measurement unit 226 measures the intensity of the heat radiation, and the control unit 210 incorporates the measurement result. The measurement value of the heat radiation acquired by performing the measurement process in Step S201 is indicated by "P201".

In the measurement process in Step S201, in some cases, the intensity of the heat radiation of the workpiece 238 may be changed depending on a continued irradiation time of the laser beam and a measurement timing of the heat radiation. In this case, the control unit 210 may perform the measurement process of the heat radiation by defining the continued irradiation time of the laser beam and the measurement timing of the heat radiation as a preset value. Alternatively, the control unit 210 may set the continued irradiation time of the laser beam to be constant, and may incorporate statistics such as the maximum value or the average value of the heat radiation during the measurement period, as the measurement result.

Next, the control unit 210 performs the measurement process on the power of the laser beam (Step S202). Specifically, the control unit 210 first moves the total reflection mirror 233 to the irradiation position of the laser beam by driving the stage 231. Next, the control unit 210 drives the laser beam source 221 with the same power setting as that in Step S201. Then, the laser beam is incident on the power measurement unit 234 after passing through the scanning optical system 222, the dichroic mirror 223, the lens 224, and the total reflection mirror 233. The power measurement unit 234 measures the power of the laser beam, and outputs the measurement result so that the control unit 210 inputs the measurement result. For example, the control unit 210 may continuously output the laser beam for a predetermined time, and may incorporate a value acquired when the output of the power measurement unit 234 is stabilized, as the measurement result. The measurement value of the power acquired by performing the measurement process in Step S202 is indicated by "P202".

Subsequently, the control unit 210 stores a combination between the measurement value P201 of the intensity of the heat radiation incorporated in Step S201 and the measurement value P202 of the power of the laser beam incorporated in Step S202, as a set of reference data Di=(P201 and P202) (Step S203).

The control unit 210 further performs the determination process in Step S204. In this manner, the control unit 210 repeatedly performs the loop processing in Steps S201 to S203 multiple times by changing the power of the laser beam source 221, for example. A plurality of reference data items D201, D202, D203, D204, and so forth are acquired by performing the loop processing multiple time in this way.

Figure 8:
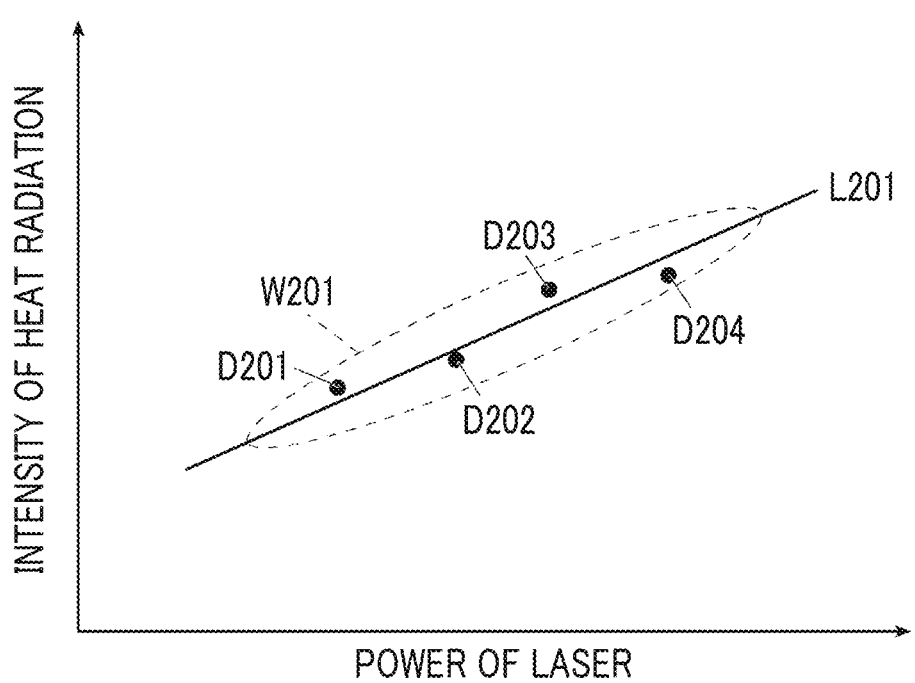
FIG. 8 is a view illustrating an example of a normal range of a measurement value stored in a storage unit.

FIG. 8 is a view illustrating an example of a normal range of the measurement value stored in the storage unit.

If the reference data is acquired, next, in the control unit 210, the data processing unit 212 adds an allowable error to reference data items D201, D202, D203, D204, and so forth, and determines the normal range of the measurement value (Step S205). For example, as illustrated in FIG. 8, a case is assumed where the four reference data items D201 to D204 are acquired. In this case, the data processing unit 212 calculates a regression line L201 indicating a correlation between the intensity of the heat radiation and the power of the laser beam, based on the plurality of reference data items D201 to D204, and determines a normal range W201 by adding the allowable error to the regression line L201.

In the above-described example, a case has been described where the data processing unit 212 determines the normal range W201, based on the plurality of reference data items D201, D202, D203, D204, and so forth. However, the data processing unit 212 may determine the normal range, based on only one reference data item D201. In this case, for example, the data processing unit 212 can determine the normal range, for example, such as "(P201/P202)±10%" by adding the allowable error to a ratio "P201/P202" between the measurement value P201 of the intensity of the heat radiation and the measurement value P202 of the power measurement unit 234.

If the data processing unit 212 determines the normal range of the measurement value, the data processing unit 212 causes the storage unit 213 to store the data indicating the normal range (Step S206). Then, the control unit 210 completes the reference data acquisition process.

Adjustment Process

Figure 9:
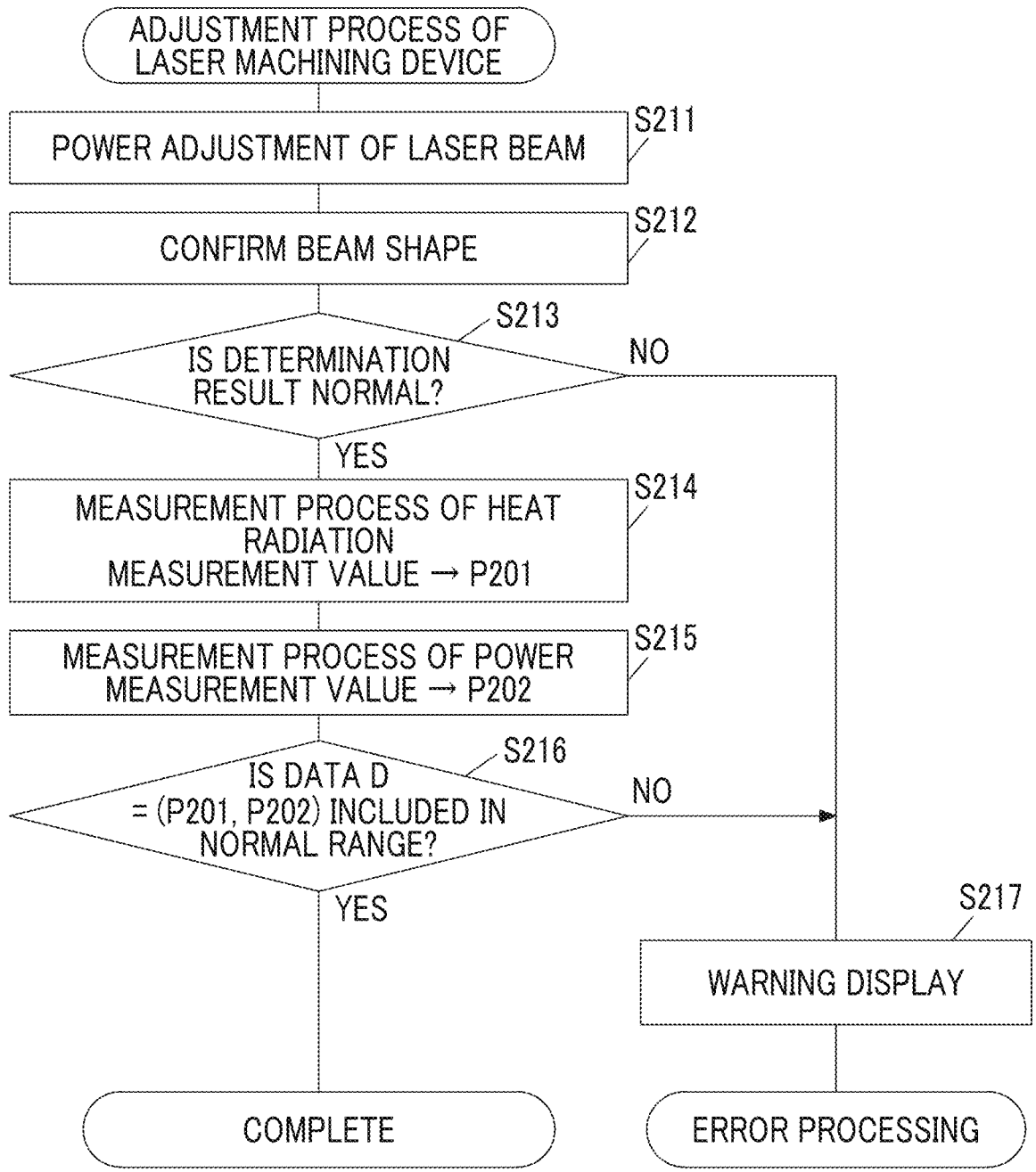
FIG. 9 is a flowchart illustrating a flow of an adjustment process of the laser machining device which is performed by the control unit.

FIG. 9 is a flowchart illustrating a flow of the adjustment process of the laser machining device which is performed by the control unit.

The adjustment process is a process performed before the machining process in order to confirm whether the workpiece 241 is irradiated with the laser beam by using the set beam shape and the set power. The adjustment process is performed at a proper timing, for example, periodically or before batch processing is performed on the plurality of workpieces 241. If a user inputs a command to start the adjustment process to the control unit 210 at the proper timing, the control unit 210 starts the adjustment process in FIG. 9.

If the adjustment process starts, the control unit 210 first performs a power adjustment process of the laser beam (Step S211). Specifically, the control unit 210 first moves the total reflection mirror 233 to the irradiation position of the laser beam by driving the stage 231. Next, the control unit 210 drives the laser beam source 221 by using the set power, and inputs the measurement result of the power measurement unit 234. Then, in a case where the measurement result deviates from the set power, the control unit 210 adjusts the set power of the laser beam source 221 so that the measurement value of the power measurement unit 234 is equal to the set value.

Subsequently, the control unit 210 performs a process of confirming the beam shape of the laser beam (Step S212). Specifically, the control unit 210 first moves the image sensor 232 to the irradiation position of the laser beam by driving the stage 231. Next, the control unit 210 drives the laser beam source 221 so as to irradiate the workpiece with the laser beam, and inputs an imaging result of the image sensor 232. Then, the control unit 210 compares the beam shape set in advance with the imaging result. As a result of the comparison, if a difference falls within the allowable range, the control unit 210 determines the result as normal. If the difference exceeds the allowable range, the control unit 210 determines the result as abnormal.

If the beam shape is confirmed, the control unit 210 determines the result (Step S213). If the result is abnormal, the control unit 210 causes the display unit 214 to display the determination result of the abnormality and the warning (Step S217), and proceeds to error processing. The warning display enables the user to inspect contamination or misalignment of the optical system, and to correct the abnormality of the beam shape.

On the other hand, if the confirmation result of the beam shape is normal, the control unit 210 proceeds to the inspection process of the power measurement unit 234 (Steps S214 to S216). That is, the control unit 210 first irradiates the workpiece for inspection 238 with the laser beam so as to perform the measurement process of the heat radiation (Step S214). The measurement value incorporated at this time is indicated by "P201". The process in Step S214 is the same as the process in Step S201 described above.

Next, the control unit 210 performs the measurement process of the power of the laser beam (Step S215). The measurement value incorporated at this time is indicated by "P202". The process in Step S215 is the same as the process in Step S202 described above. The set power of the laser beam source 221 driven in Step S215 is set to be the same as the set power of the laser beam source 221 driven in Step S214.

If the measurement value is incorporated, subsequently, the control unit 210 compares data D=(P201 and P202) incorporated by the determination unit 211 with the data (refer to FIG. 8) indicating the normal range W201 stored in the storage unit 213. Then, the determination unit 211 determines whether or not the data D is included in the normal range W201 (Step S216).

As a result of the determination in Step S216, if the data D is included in the normal range W201, the control unit 210 completes the adjustment process without displaying the warning of the abnormality. In this case, the user can determine that the laser machining device 201 is normally adjusted, and can proceed to the machining process of the workpiece 241.

On the other hand, as a result of the determination of the determination unit 211 in Step S216, if the data D is not included in the normal range W201, the control unit 210 causes the display unit 214 to display the warning of the abnormality (Step S217), and proceeds to the error processing. In this case, the warning display enables the user to determine that the adjustment of the laser machining device 201 is not normal. For example, the user can stop the laser machining device 201, and can investigate which is a cause of the abnormality. In this way, the user can avoid a possibility that the machining process of the workpiece may be performed in an abnormal state and a yield rate may be lowered.

As described above, according to the laser machining device 201 of Embodiment 2, in the adjustment process, it is determined whether or not the data D=(P201 and P202) of the combination between the measurement value "P201" of the power of the laser beam and the measurement value "P202" of the heat radiation falls within the normal range. In this manner, in a case where the measurement error exceeding the allowable range occurs in the power measurement unit 234, the measurement error can be detected.

In addition, according to the laser machining device 201 of Embodiment 2, the pseudo-workpiece for inspection 238 is provided. The inspection process of the power measurement unit 234 is performed using the same workpiece 238 every time in the inspection processes performed multiple times. Therefore, due to the influence of an individual difference in the workpieces 238, a difference may occur in the measurement values "P202" of the heat radiation. Accordingly, it is possible to avoid a possibility that the power measurement unit 234 may erroneously determine the difference as abnormal.

In addition, according to the laser machining device 201 of Embodiment 2, the data processing unit 212 calculates the normal range of the combination data D, based on the reference data items D201, D202, D203, D204, and so forth which are acquired in the reference data acquisition process in FIG. 7, and causes the storage unit 213 to store the data indicating the normal range. Therefore, even in a case where a use environment or a use condition of the laser machining device 201 is changed, the correct inspection of the power measurement unit 234 can be performed by acquiring the reference data again and updating the data of the normal range.

Hitherto, Embodiment 2 according to the present invention has been described. However, the present invention is not limited to Embodiment 2 described above. For example, in Embodiment 2 described above, a case where the present invention is applied to the laser annealing device has been described as an example. However, the present invention is similarly applicable to various laser machining devices such as a laser drilling device and a laser welding device. In addition, in Embodiment 2 described above, a configuration has been described as follow. The wafer of the semiconductor element material is set as the workpiece. The workpiece for inspection has a pseudo-configuration formed of the same material as that of the actual workpiece. However, the workpiece for inspection may not be formed of the same material as that of the actual workpiece, and may be the workpiece manufactured exclusively for inspection. In this case, the workpiece may be called a laser irradiation workpiece for inspection. In addition, in Embodiment 2 described above, an example has been described where the power of the laser beam of the machining target position P200 is adjusted by adjusting the power of the laser beam source 221. However, instead of adjusting the power of the laser beam source 221, a configuration may be adopted in which the power of the laser beam of the machining target position P200 is adjusted by adjusting an attenuation factor of the laser beam in the optical system through which the laser beam passes. Alternatively, detailed portion described in Embodiment 2 can be appropriately modified within the scope not departing from the gist of the invention.

Hereinafter, some of the inventions according to Embodiment 2 will be described.

Invention 1

A laser machining device includes a power measurement unit that measures power of a laser beam emitted from a laser beam source, a heat radiation measurement unit that measures intensity of heat radiation of a workpiece irradiated with a laser beam, and a determination unit that determines whether a combination between the power of the laser beam measured by the power measurement unit and the intensity of the heat radiation measured by the heat radiation measurement unit is included in a predetermined range.

Invention 2

In the laser machining device according to Invention 1, in performing inspection processes of the power measurement unit at least multiple times, the heat radiation measurement unit measures the intensity of the heat radiation, each time the same workpiece is irradiated with the laser beam.

Invention 3

The laser machining device according to Invention 1 or 2 further includes a display unit that displays a determination result of the determination unit.

Invention 4

In the laser machining device according to any one of Inventions 1 to 3, the predetermined range indicates a normal range of a combination between the power of the laser beam and the intensity of the heat radiation.

Invention 5

The laser machining device according to any one of Inventions 1 to 3 further includes a data processing unit that calculates the predetermined range from data having a plurality of combinations between the power of the laser beam measured by the power measurement unit and the intensity of the heat radiation measured by the heat radiation measurement unit, and a storage unit that stores data indicating the predetermined range calculated by the data processing unit.

Advantageous Effect of Inventions Disclosed in Embodiment 2

According to these inventions, during the machining process, it is possible to provide the laser machining device which can detect the measurement error in a case where the measurement error exceeds the allowable range in the power measurement unit.

Embodiment 3

In the related art, a laser machining device is known which carries out machining work for a workpiece by irradiating and heating a machining target position with a laser beam. The laser machining device includes a laser annealing device that performs annealing treatment on a surface portion of the workpiece by defining a wafer of a semiconductor element material as the workpiece and using the laser beam. PTL 5 (Japanese Unexamined Patent Publication No. 2000-200760) discloses a laser annealing device that includes a sensor for measuring energy of the laser beam and an attenuator capable of changing transmittance of the laser beam, and that controls the attenuator, based on a measurement value of the energy of the laser beam. PTL 6 (Japanese Unexamined Patent Publication No. 2001-338893) discloses a laser annealing device that includes a sensor for measuring a beam shape of the laser beam and an attenuator capable of changing the transmittance of the laser beam, and that controls the attenuator, based on intensity per unit area of the laser beam.

In the laser machining device that carries out machining work by irradiating and heating the machining target position with the laser beam, it is preferable to properly control the temperature of the machining target position when the machining target position is irradiated with the laser beam. According to the techniques respectively disclosed in PTL 5 and PTL 6, the intensity of the laser beam is controlled to be constant. In this manner, the techniques aim to improve machining quality or machining safety of the machining target position.

However, through investigations, the present inventors have clearly found out the followings. Even in a case where the workpiece is irradiated with the laser beam having constant intensity, the temperature of the machining target position may not be uniform. For example, in a case of the laser annealing device that performs the annealing treatment on the workpiece by scanning the entire surface of the workpiece with the laser beam, even if the laser beam having the constant intensity is used for the scanning, the temperature in an edge portion of the workpiece having a folded scanning route is higher than the temperature of other portions. In addition, in a case where the beam shape of the laser beam is right-left asymmetry, when the scanning is performed leftward with the laser beam and when the scanning is performed rightward with the laser beam, a difference may occur in uneven temperature of the machining target position. In addition, in general, even if the workpiece is irradiated with the laser beam having the constant intensity, due to a state of the surface portion of the workpiece, the difference may occur in the temperature heated by the laser beam.

The invention according to Embodiment 3 aims to provide a laser machining device which can properly control the heating temperature of the machining target position.

Figure 10:
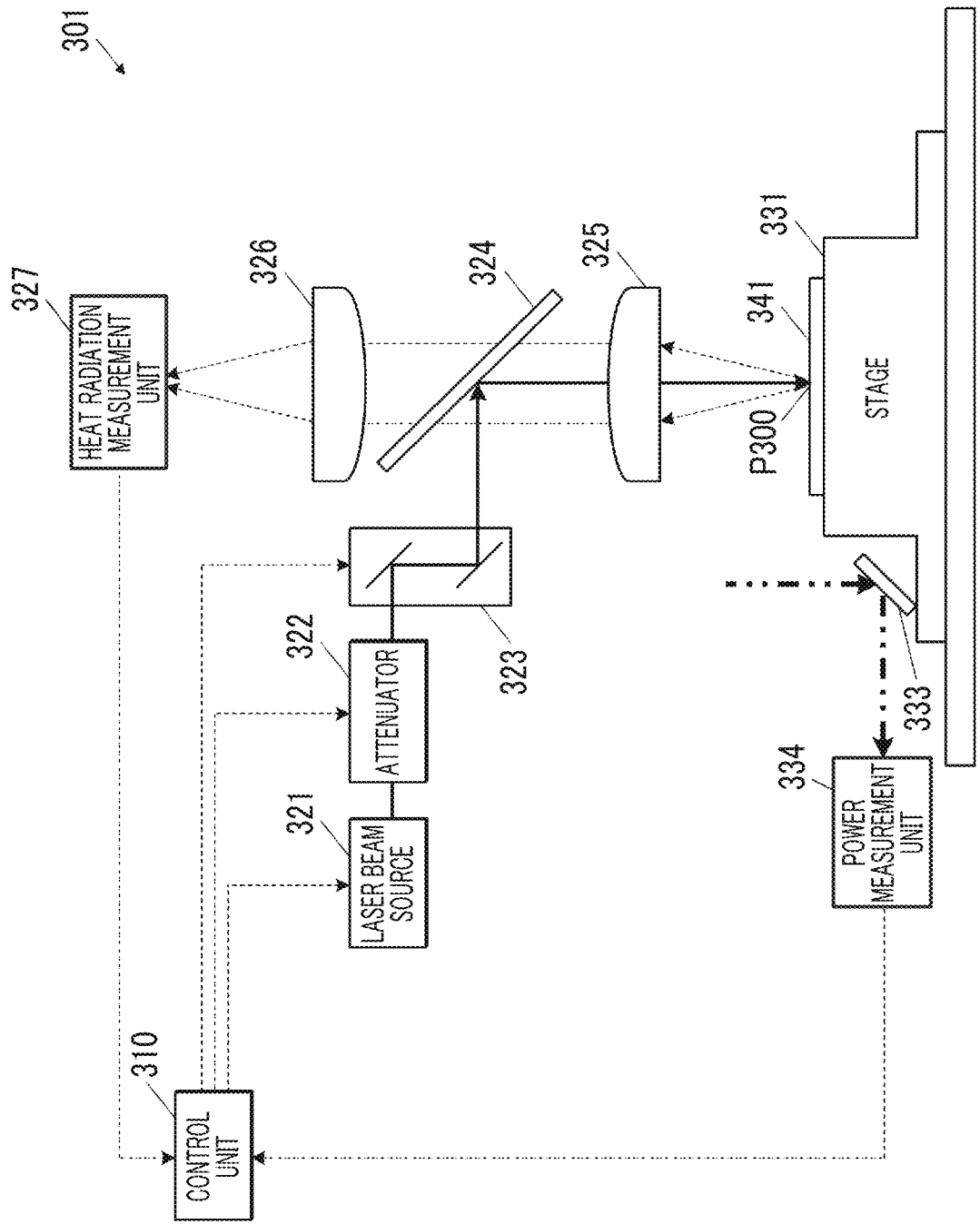
FIG. 10 is a configuration diagram illustrating a laser machining device according to Embodiment 3 of the present invention.

Subsequently, a laser machining device 301 according to Embodiment 3 will be described. FIG. 10 is a configuration diagram illustrating the laser machining device according to Embodiment 3 of the present invention. In FIG. 10, the optical axis of the laser beam is illustrated using a solid line or a two-dot chain line, the heat radiation is illustrated using a thick broken line, and the control line and the signal line of the measurement result are illustrated using a thin broken line.

The laser machining device 301 according to Embodiment 3 is a laser annealing device that performs the annealing treatment by defining the wafer of the semiconductor element material as a workpiece 341 and irradiating the workpiece 341 with the laser beam. The laser machining device 301 includes a control unit 310, a laser beam source 321, an attenuator 322 serving as a transmittance change unit, a scanning optical system 323 serving as a scanning unit, a dichroic mirror 324, lenses 325 and 326, a heat radiation measurement unit 327, a stage 331, a total reflection mirror 333, and a power meter 334.

For example, the laser beam source 321 is a solid laser such as a YAG laser or a gas laser such as a $CO_2$ laser, and outputs the laser beam with which the surface portion of the workpiece 341 is irradiated to a high temperature. The laser beam source 321 outputs a near infrared beam whose wavelength is at an upper limit of a visible light wavelength range, for example, such as the wavelength of 808 nm. The laser beam source 321 may be called a laser oscillator.

The attenuator 322 is a module which can change the light transmitting amount of the laser beam. The attenuator 322 changes reflectance or absorptivity of the laser beam, based on a control signal. In this manner, the attenuator 322 can continuously change the light transmitting amount of the laser beam.

For example, the scanning optical system 323 includes a galvano mirror, and can change the irradiation position of the laser beam, that is, a machining target position P300, in two directions along an upper surface of the stage 331, for example.

The dichroic mirror 324 reflects the light having the output wavelength of the laser beam source 321, and transmits the light in the infrared region including the heat radiation. A wavelength of the infrared region to be transmitted is 2 to 3 μm, for example. In the infrared region, a wavelength which is less absorbed by the workpiece 341 (for example, a single crystal wafer) is set.

For example, the lens 325 is an Fθ lens, and converges the laser beam to the machining target position. In addition, the lens 325 collects the heat radiation from the machining target position P300 of the workpiece.

The lens 326 converges the heat radiation collected by the lens 325 and transmitted through the dichroic mirror 324 to the heat radiation measurement unit 327.

For example, the heat radiation measurement unit 327 measures the intensity of the heat radiation input to the light receiving unit which is the infrared sensor.

The stage 331 holds the workpiece 341, and is configured to be movable in two directions intersecting the optical axis of the laser beam. The stage 331 holds the total reflection mirror 333 at a location different from a region for holding the workpiece 341.

The total reflection mirror 333 can be moved to the irradiation position of the laser beam (optical axis position of the laser beam emitted from the lens 325 for irradiation) by driving the stage 331. The total reflection mirror 333 reflects the laser beam, and transmits the reflected laser beam to the power meter 334 at the irradiation position of the laser beam. In FIG. 10, the optical axis of the laser beam when the total reflection mirror 333 is moved to the irradiation position of the laser beam is illustrated by a two-dot chain line.

The power meter 334 receives the laser beam so as to measure the power of the laser beam. The power means the energy per unit time of the laser beam.

The control unit 310 is a computer having a storage device for storing a program, a central processing unit (CPU) for executing the program, a working memory, an I/O for inputting and outputting the control signal and the detection signal, and various functional circuits. The control unit 310 performs drive control of the laser beam source 321, drive control of the scanning optical system 323, and drive control of the attenuator 322. Furthermore, the control unit 310 inputs the measurement value of the heat radiation measurement unit 327 and the measurement value of the power meter 334. The control unit 310 corresponds to an example of the determination unit according to the present invention, and determines a state of the attenuator 322, based on the measurement value of the heat radiation measurement unit 327 and the measurement value of the power meter 334.

Figure 11:
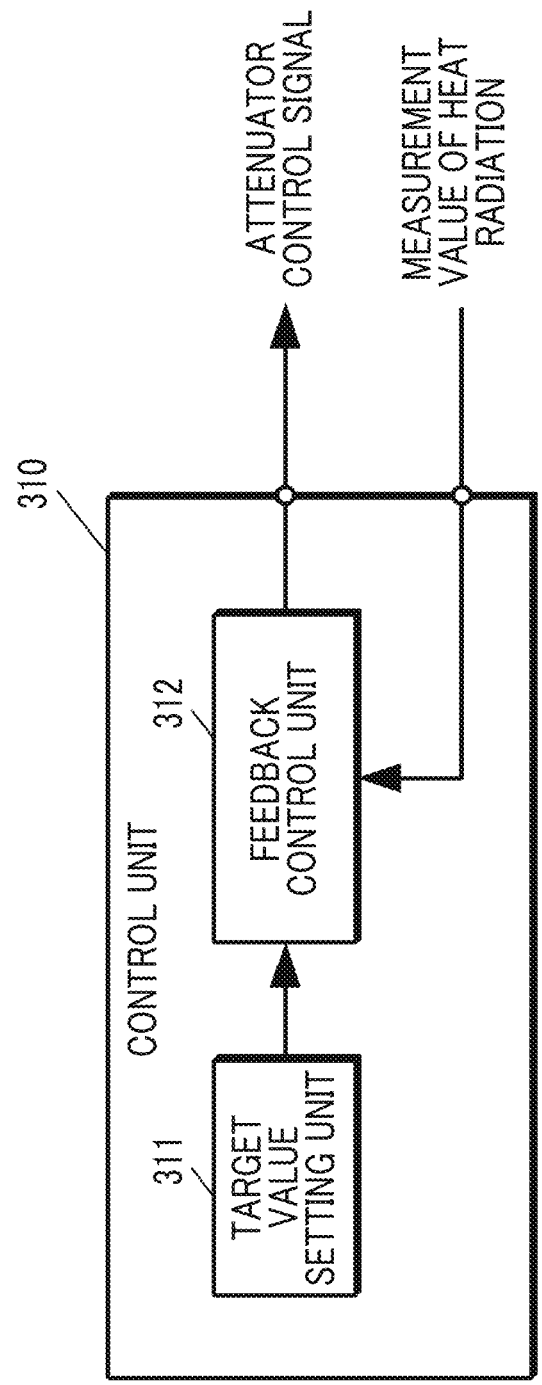
FIG. 11 is a block diagram illustrating a partial internal configuration of the control unit.

FIG. 11 is a block diagram illustrating a partial internal configuration of the control unit.

The control unit 310 further has a target value setting unit 311 and a feedback control unit 312.

The target value setting unit 311 calculates a target value of the heat radiation to be discharged from the workpiece during the machining process. For example, the target value of the heat radiation is set to a constant value corresponding to an ideal heating temperature of the workpiece. Alternatively, in a case where the ideal heating temperature differs depending on the scanning position, the target value of the heat radiation may be set to a value which is changed in accordance with the scanning position. The ideal heating temperature may be included in the machining data input from the user to the control unit 310. The target value setting unit 311 may calculate the ideal heating temperature, based on various parameters included in the machining data. The machining data is data for defining a place and a method of irradiating the workpiece with the laser beam, and is prepared by the user. The target value setting unit 311 outputs the target value to the feedback control unit 312 in a scanning period in which the workpiece is irradiated with the laser beam.

The feedback control unit 312 inputs the target value set by the target value setting unit 311 and the measurement value of the heat radiation measurement unit 327. The feedback control unit 312 performs a feedback process so as to reduce a difference between the input target value and the measurement value, based on the difference, and generates an attenuator control signal. The attenuator control signal is transmitted to the attenuator 322 so as to control the amount of the laser beam transmitted through the attenuator 322. The feedback control unit 312 may be configured to generate the attenuator control signal by performing proportional-integral-differential (PID) control.

Description of Operation

According to the laser machining device 301 configured as described above, first, the output adjustment of the laser beam source 321 is performed in a front stage of the annealing treatment of the workpiece 341. When the output adjustment is performed, the stage 331 moves so that the total reflection mirror 333 is located at the irradiation position of the laser beam, and the attenuator 322 is controlled to have predetermined transmittance (for example, 100%). Then, the control unit 310 emits the laser beam from the laser beam source 321, and inputs the measurement value of the power meter 334. In this manner, the output of the laser beam source 321 is adjusted so that the power of the laser beam has a set value.

Subsequently, the annealing treatment of the workpiece 341 starts in a state where the workpiece 341 held by the stage 331 is located at the irradiation position of the laser beam. In the annealing treatment, the laser beam is emitted from the laser beam source 321 under the control of the control unit 310. Then, the machining target position P300 of the workpiece 341 is irradiated with the laser beam passing through the attenuator 322, the scanning optical system 323, the dichroic mirror 324, and the lens 325. When the machining target position P300 is irradiated with the laser beam, the machining target position P300 of the workpiece 341 is heated, and the heat radiation is discharged from the machining target position P300. The heat radiation is transferred to the heat radiation measurement unit 327 by way of the lens 325, the dichroic mirror 324, and the lens 326, and the heat radiation measurement unit 327 measures the amount of the heat radiation. The control unit 310 controls the scanning optical system 323 while continuously driving the laser beam source 321, and changes the irradiation position of the laser beam along the scanning route set in the machining data.

While the laser beam source 321 is continuously driven, the feedback control unit 312 inputs the measurement value of the heat radiation measurement unit 327 and the target value set by the target value setting unit 311, and generates the attenuator control signal so as to reduce a difference therebetween. Then, the transmission amount of the laser beam passing through the attenuator 322 is controlled using the attenuator control signal. In this manner, the power of the laser beam used in irradiating the machining target position P300 is adjusted, and the heating temperature of the machining target position P300 is controlled to be close to the ideal temperature set in advance.

Here, description will be made on the amount of the heat radiation discharged from the workpiece 341 in a case where the annealing treatment is performed without performing the control in this way.

Figure 12A:
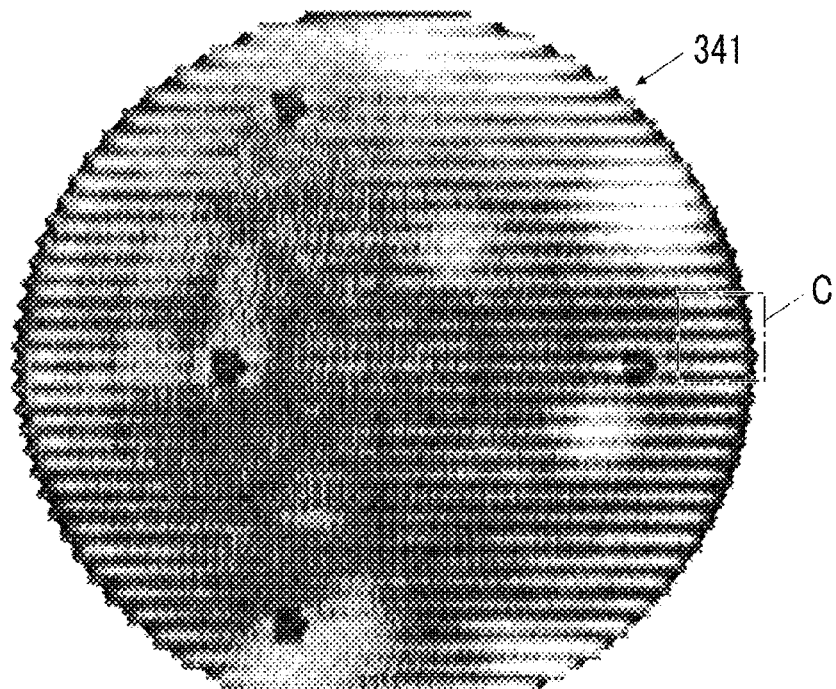
FIG. 12A illustrates an example of temperature distribution measured when a surface portion of a wafer is scanned with a laser beam having constant intensity, and is a view illustrating the overall wafer.
Figure 12B:
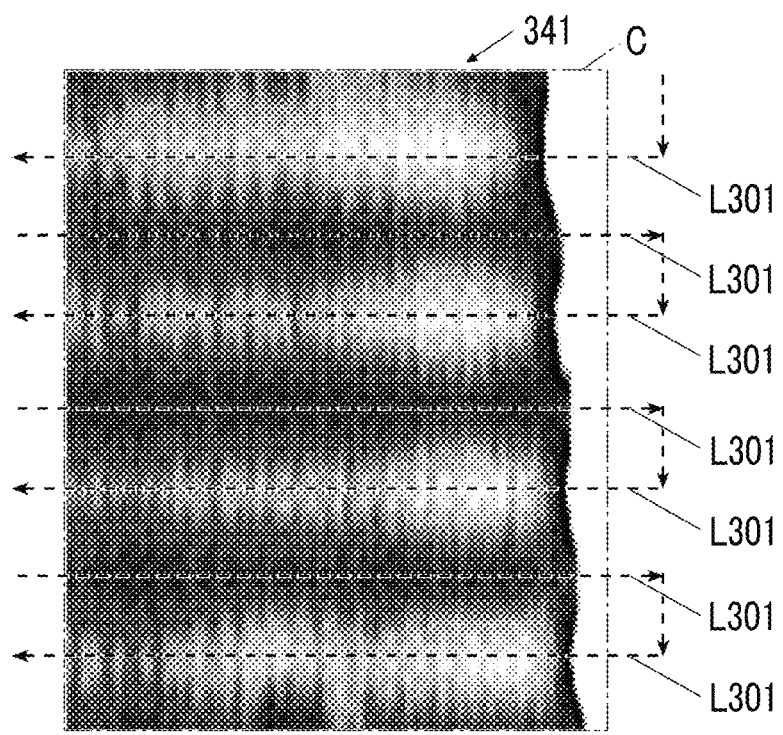
FIG. 12B is an enlarged view of a range C in FIG. 12A.

FIGS. 12A and 12B illustrate an example of the temperature distribution measured when the surface portion of the wafer is scanned with the laser beam having the constant intensity. FIG. 12A is a view illustrating the overall wafer, and FIG. 12B is an enlarged view illustrating a range C. FIGS. 12A and 12B illustrate a high temperature and a low temperature by using gray shades. The darker one represents the low temperature. An example illustrated in FIGS. 12A and 12B shows the following case. A scanning route L301 extends in an X-direction, a plurality of the scanning routes L301 are juxtaposed with each other in a Y-direction, and the scanning using the laser beam is performed along the scanning routes L301. The irradiation position of the laser beam is folded back in an edge portion of the respective scanning routes L301, and moves to the adjacent scanning route L301 so that a scanning direction is reversed in the two adjacent scanning routes L301.

In this scanning pattern, even if the intensity of the laser beam is constant, as illustrated in FIG. 12A, the edge portion of the workpiece 341 has a higher temperature than the central portion. The reason is as follows. As illustrated in FIG. 12B, in the edge portion of the workpiece 341, the scanning using the laser beam is performed from the center toward the end. Thereafter, while the heat remains in a periphery thereof, the scanning using the laser beam is performed from the end toward the center along the adjacent scanning route L301. That is, the reason is considered that the heat of the laser beam is added to the residual heat.

Figure 13:
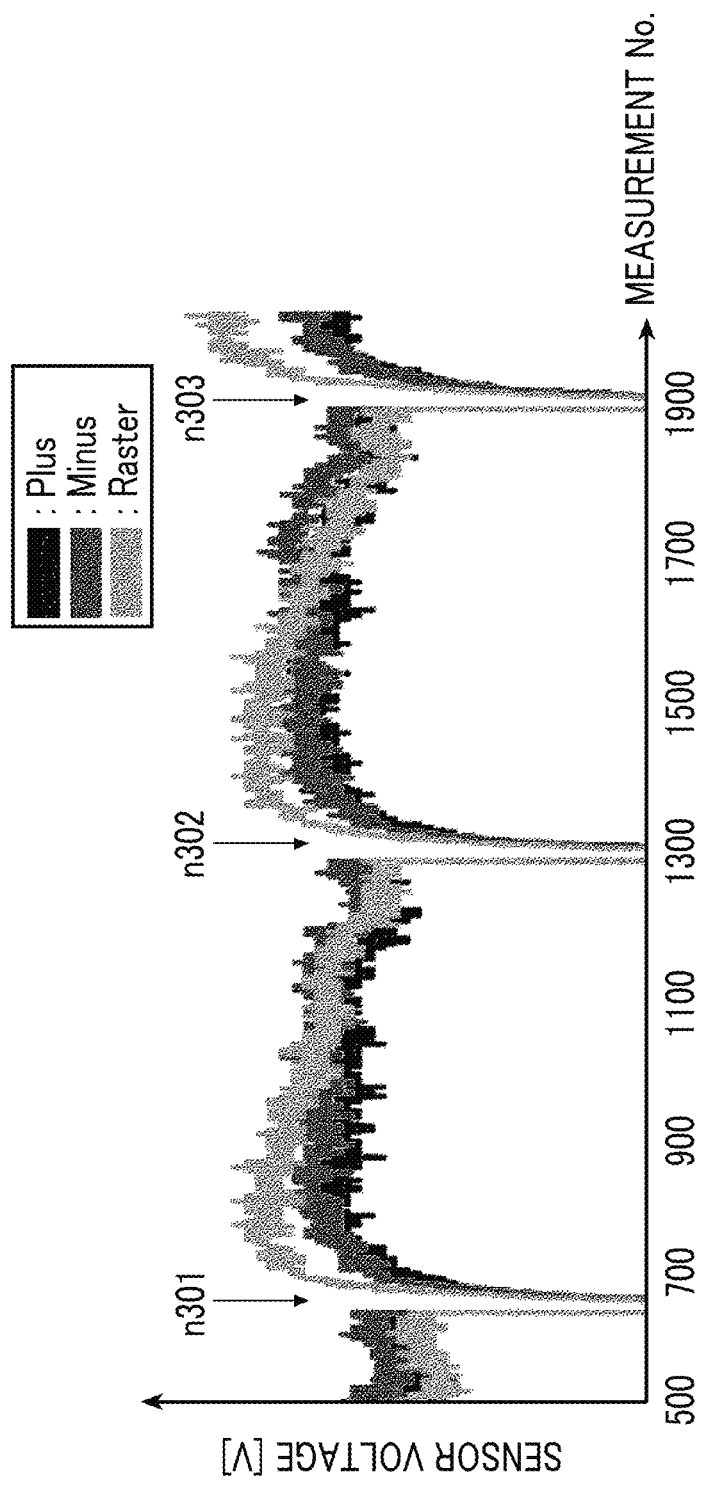
FIG. 13 is a graph illustrating a measurement value of heat radiation corresponding to three scanning patterns.
Figure 14A:
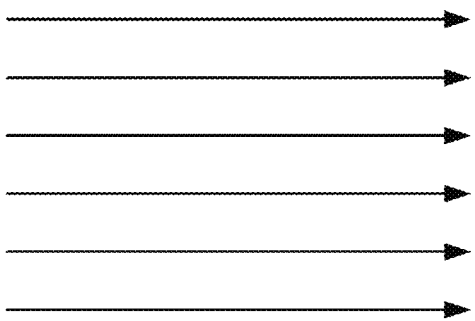
FIGS. 14A to 14C are views for describing each of the three scanning patterns in FIG. 13.
Figure 14B:
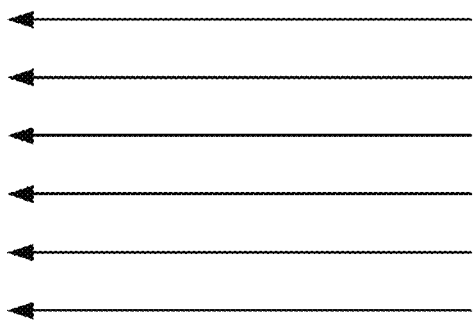
Figure 14C:
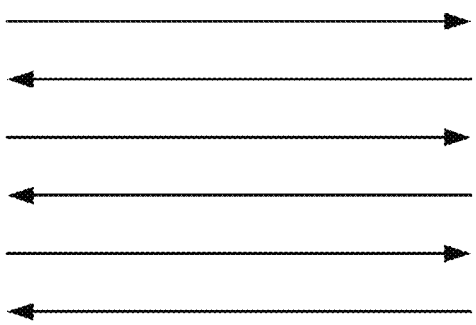

FIG. 13 illustrates a graph of the measurement values of the heat radiation corresponding to three scanning patterns. Out of the three scanning patterns in FIG. 13, FIG. 14A is a view for describing the scanning pattern of "Plus", FIG. 14B is a view for describing the scanning pattern of "Minus", and FIG. 14C is a view for describing the scanning pattern of "Raster". In each graph in FIG. 13, a vertical axis represents a sensor voltage of the heat radiation measurement unit 327, and a horizontal axis represents a measurement number. The measurement number is a serial number added to each measurement value in time series. Three graph lines in FIG. 13 represent the measurement values measured using the scanning patterns in FIGS. 14A to 14C.

The example in FIGS. 12A and 12B described above corresponds to the example when the scanning pattern in FIG. 14C is applied. If the measurement values of the heat radiation in this case are juxtaposed with each other in time series, the graph of "Raster" in FIG. 13 is obtained. Dropped locations n301 to n303 in FIG. 13 indicate times at which one linear scanning route L301 is switched to an adjacent linear scanning route L301. From the graph of "Raster" in FIG. 13, it can be understood that the heat radiation becomes higher immediately after the scanning route L301 is folded back.

In addition, as illustrated in FIGS. 14A and 14B, even in a case of the scanning pattern in one direction ("Plus") or the scanning pattern in the reverse direction ("Minus"), if the intensity of the laser beam is constant, the amount of the heat radiation is not uniform as illustrated in FIG. 13. Furthermore, from the graph in FIG. 13, it can be understood that there is a difference in appearance forms of the heat radiation between the scanning in one direction and the scanning in the reverse direction. The reason is considered as follows. The beam shapes of the laser beams are not perfectly symmetrical between one side and the other side along the scanning direction. Depending on the scanning direction of the laser beam, a difference occurs in temporal change patterns of the intensity of the laser beams used in irradiating the same point. The beam shape means the intensity distribution inside the spot of the laser beam, and is also called a beam profile.

In this way, in a case where the annealing treatment is performed using the laser beam having constant power, the heating temperature of the surface portion of the workpiece is not uniform depending on the scanning pattern or the scanning direction.

On the other hand, according to the laser machining device 301 of Embodiment 3, the light quantity of the laser beam used in irradiating the machining target position P300 is controlled under the feedback control based on the measurement value of the heat radiation so that the measurement value of the heat radiation is close to the target value. In this manner, the non-uniform heating temperatures of the surface portion of the workpiece as illustrated in FIGS. 12 and 13 are reduced. For example, a proper heating process can be realized so that the heating temperatures of the respective portions can be approximately uniform.

As described above, according to the laser machining device 301 of Embodiment 3, the heating process can be performed on the machining target position P300 of the workpiece 341 to have the proper temperature under the control of the attenuator 322, based on the measurement value of the heat radiation. In this manner, the annealing treatment can be performed at the proper heating temperature, for example, so that the respective portions of the surface portion of the workpiece 341 can have the uniform heating temperature.

In addition, according to the laser machining device 301 of Embodiment 3, the feedback control unit 312 controls the attenuator 322, based on the difference between the target value and the measurement value of the heat radiation. Accordingly, the heating temperature can be easily set and changed by defining the target value.

Hitherto, Embodiment 3 according to the present invention has been described. However, the present invention is not limited to Embodiment 3 described above. For example, in Embodiment 3 described above, a configuration in which the present invention is applied to the laser annealing device has been described as an example. However, the present invention is similarly applicable to a laser welding device or a laser soldering device which performs welding or soldering by irradiating the workpiece with the laser beam. Furthermore, the present invention is also applicable to a laser drilling device which forms a hole in a substrate by irradiating the substrate with the laser beam. For example, the laser drilling device forms the hole by irradiating one location multiple times with a pulse of the laser beam. However, based on the amount of heat radiation measured when the pulse of the first laser beam is output, it is possible to control the transmission amount of the second and subsequent laser beams. In a case where the heating amount obtained by the laser beam deviates from a proper value depending on the position of the substrate for forming the hole, the heating amount obtained by the second and subsequent laser beams can have the proper value under this control. In this manner, the respective holes can be formed to have uniform quality.

In addition, in Embodiment 3 described above, the scanning optical system 323 which changes the irradiation position of the laser beam has been described as the scanning unit. However, the scanning unit according to the present invention may be configured to change the position irradiated with the laser beam by moving the workpiece 341. Alternatively, detailed portions described in the embodiments can be appropriately modified within the scope not departing from the gist of the invention.

Hereinafter, some of the inventions according to Embodiment 3 will be described.

Invention 1

A laser machining device includes a transmittance change unit capable of changing transmittance of a laser beam, a heat radiation measurement unit that measures heat radiation of a workpiece irradiated with a laser beam passing through the transmittance change unit, and a control unit that controls the transmittance of the laser beam in the transmittance change unit, based on a measurement value of the heat radiation measured by the heat radiation measurement unit.

Invention 2

The laser machining device according to Invention 1 further includes a scanning unit that changes an irradiation position of the workpiece irradiated with the laser beam. The scanning unit performs annealing treatment on the workpiece.

Invention 3

In the laser machining device according to Invention 1 or 2, the control unit has a feedback control unit that generates a control signal to be output to the transmittance change unit, based on a difference between a target value of the heat radiation and the measurement value of the heat radiation.

Advantageous Effect of Inventions Disclosed in Embodiment 3

According to the inventions disclosed in Embodiment 3, an advantageous effect is achieved in that the heating temperature of the machining target position can be properly controlled.

The present invention is applicable to a laser machining device.

It should be understood that the invention is not limited to the above-described embodiment, but may be modified into various forms on the basis of the spirit of the invention. Additionally, the modifications are included in the scope of the invention.

What is claimed is:

1. A laser machining device comprising:
a scanner that is configured to change an irradiation position of a workpiece irradiated with a laser beam; a sensor that is configured to measure intensity of heat radiation of the workpiece irradiated with the laser beam; and a controller that includes a display and is configured to control the scanner, wherein the controller is configured to: determine an abnormal location of the workpiece, based on the intensity of the heat radiation measured by the sensor,
compare a measurement value of the heat radiation at each scanning position with one or both of an upper limit threshold and a lower limit threshold for identifying an abnormality,
compare the measurement value obtained at a first position of the workpiece with the measurement value obtained at a position of the workpiece other than the first position,
two-dimensionally arrange a series of data items of the measurement values of the heat radiation in accordance with the scanning positions, compare the measurement value obtained at the first position of the workpiece with the measurement value obtained at the position of the workpiece other than the first position, based on the data of the measurement value of the heat radiation, and analyze whether or not a distribution of a measurement value has a predetermined characteristic and determine a pattern of a warpage of the workpiece, a position of the warpage, or a size of the warpage, based on a result of the analysis, and the display is configured to display, based on a determination result of the controller, a type of the abnormality and a location of the abnormality in the workpiece.

2. The laser machining device according to claim 1, wherein the controller is configured to control a state of the workpiece based on the state that is determined by the controller.

3. The laser machining device according to claim 1, wherein the controller is configured to determine whether or not the first position or the position of the workpiece other than the first position of the workpiece is abnormal, based on a comparison between the intensity of the heat radiation obtained when the first position of the workpiece is irradiated with the laser beam and the intensity of the heat radiation obtained when the position of the workpiece other than the first position is irradiated with the laser beam.

4. The laser machining device according to claim 1, wherein the workpiece is a wafer of a semiconductor element material, and the controller is configured to determine a crack, foreign substance contamination, or warpage of the workpiece.

5. The laser machining device according to claim 2, wherein the display is configured to display, based on the determination result of the controller, a warning light or a notification of the abnormality.

6. The laser machining device according to claim 1, wherein the controller is configured to output the abnormal location.

7. The laser machining device according to claim 2, wherein the controller is configured to identify the abnormality by comparing a measurement value of the heat radiation at each scanning position with one or both of an upper limit threshold and a lower limit threshold.

8. The laser machining device according to claim 2, wherein the controller is configured to:
perform drive control of a scanning optical system, and
compare a measurement value obtained at each scanning position with a measurement value obtained at a front stage position and a measurement value obtained at a rear stage position.

9. A laser machining method comprising:
changing, by a scanner, an irradiation position of a workpiece irradiated with a laser beam; measuring, by a sensor, intensity of heat radiation of the workpiece irradiated with the laser beam; determining, by a controller, an abnormal location of the workpiece, based on the intensity of the heat radiation measured by the sensor; comparing, by the controller, a measurement value of the heat radiation at each scanning position with one or both of an upper limit threshold and a lower limit threshold for identifying an abnormality; comparing, by the controller, the measurement value obtained at a first position of the workpiece with the measurement value obtained at a position of the workpiece other than the first position; two-dimensionally arranging, by the controller, a series of data items of the measurement values of the heat radiation in accordance with the scanning positions; comparing, by the controller, the measurement value obtained at the first position of the workpiece with the measurement value obtained at the position of the workpiece other than the first position, based on the data of the measurement value of the heat radiation; analyzing, by the controller, whether or not a distribution of a measurement value has a predetermined characteristic and determining a pattern of a warpage of the workpiece, a position of the warpage, or a size of the warpage, based on a result of the analysis by the controller, and displaying, by a display, based on a determination result of the controller, a type of the abnormality and a location of the abnormality in the workpiece.

10. The laser machining device according to claim 1, wherein the type of abnormality is one of a crack, foreign substance contamination, and the warpage.

* * * * *